US009466708B2

(12) United States Patent
Padmanabhan et al.

(10) Patent No.: US 9,466,708 B2
(45) Date of Patent: Oct. 11, 2016

(54) METHOD OF FORMING A TRANSISTOR AND STRUCTURE THEREFOR

(71) Applicants: Balaji Padmanabhan, Tempe, AZ (US); Prasad Venkatraman, Gilbert, AZ (US); Gordon M. Grivna, Mesa, AZ (US)

(72) Inventors: Balaji Padmanabhan, Tempe, AZ (US); Prasad Venkatraman, Gilbert, AZ (US); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 72 days.

(21) Appl. No.: 13/831,883

(22) Filed: Mar. 15, 2013

(65) Prior Publication Data
US 2014/0264565 A1  Sep. 18, 2014

(51) Int. Cl.
| | |
|---|---|
| *H01L 21/02* | (2006.01) |
| *H01L 29/66* | (2006.01) |
| *H01L 21/70* | (2006.01) |
| *H01L 29/78* | (2006.01) |
| *H01L 29/40* | (2006.01) |
| *H01L 29/417* | (2006.01) |
| *H01L 29/423* | (2006.01) |
| *H01L 29/51* | (2006.01) |

(52) U.S. Cl.
CPC ......... *H01L 29/7813* (2013.01); *H01L 29/407* (2013.01); *H01L 29/4175* (2013.01); *H01L 29/41766* (2013.01); *H01L 29/4236* (2013.01); *H01L 29/66621* (2013.01); *H01L 29/66636* (2013.01); *H01L 29/66734* (2013.01); *H01L 29/7834* (2013.01); *H01L 29/7835* (2013.01); *H01L 29/513* (2013.01)

(58) Field of Classification Search
None
See application file for complete search history.

(56) References Cited

U.S. PATENT DOCUMENTS

| | | | |
|---|---|---|---|
| 6,906,380 B1 | 6/2005 | Pattanayak | |
| 7,282,406 B2 | 10/2007 | Grivna | |
| 7,633,120 B2 | 12/2009 | Herbert | |
| 8,304,314 B2 | 11/2012 | Pearse | |
| 2006/0113589 A1 | 6/2006 | Jones | |
| 2007/0207582 A1* | 9/2007 | Grivna et al. | 438/270 |

OTHER PUBLICATIONS

Francine Robb, et al., A New P-Channel Bidirectional Trench Power MOSFET for Battery Charging and Protection, Proceedings of The 22nd International Symposium on Power Semiconductor Devices & ICs, 405-408.

\* cited by examiner

*Primary Examiner* — Mohammad Islam
*Assistant Examiner* — Jay C Chang
(74) *Attorney, Agent, or Firm* — Robert F. Hightower

(57) ABSTRACT

In one embodiment, a semiconductor device is formed to include a gate structure extending into a semiconductor material that is underlying a first region of semiconductor material. The gate structure includes a conductor and also a gate insulator that has a first portion positioned between the gate conductor and a first portion of the semiconductor material that underlies the gate conductor. The first portion of the semiconductor material is configured to form a channel region of the transistor which underlies the gate conductor. The gate structure may also include a shield conductor overlying the gate conductor and having a shield insulator between the shield conductor and the gate conductor. The shield insulator may also have a second portion positioned between the shield conductor and a second portion of the gate insulator and a third portion overlying the shield conductor.

19 Claims, 23 Drawing Sheets

METHOD OF FORMING A TRANSISTOR AND STRUCTURE THEREFOR

The present application is related to U.S. patent application Ser. No. 13/590,947 entitled BIDIRECTIONAL FIELD EFFECT TRANSISTOR AND METHOD, a common inventor, and a common assignee, and which is hereby incorporated herein by reference. The present application is also related to a United States patent application having an Ser. No. 13/831,1887 having common inventors Balaji Padmanabhan et al. and a common assignee, which is filed concurrently herewith and which is hereby incorporated herein by reference.

BACKGROUND OF THE INVENTION

The present invention relates, in general, to electronics, and more particularly, to semiconductors, structures thereof, and methods of forming semiconductor devices.

In the past, the semiconductor industry utilized various different device structures and methods to form metal oxide semiconductor (MOS) transistor. One particular structure for a vertical power MOS transistor utilized trenches that were formed in an active area of the transistor. A portion of the trenches were utilized as the gate regions of the transistor. Some of these transistors also had a shield conductor that assisted in lowering the gate-to-drain capacitance of the transistor.

One problem with the prior transistors was the switching speed. Typically, the shield conductor had a high resistance and also had a high capacitance that reduced the switching speed of the transistor. Additionally, it was more difficult to manufacture the shield conductor which increased the cost of the transistor.

Accordingly, it is desirable to have an MOS transistor that has a higher switching frequency, that is easier to manufacture, and that has a lower cost.

Figure 1:
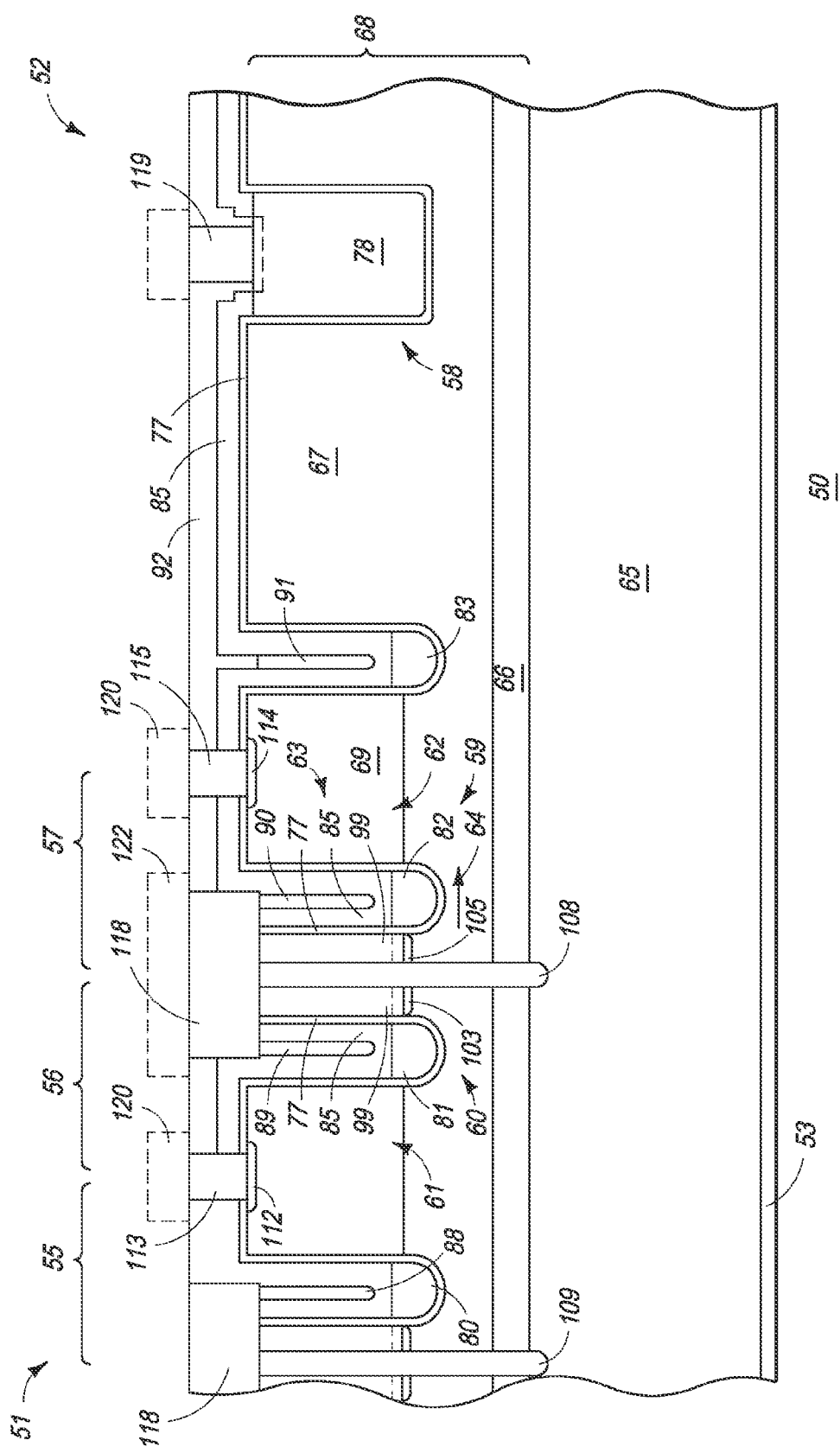
FIG. 1 illustrates an enlarged cross-sectional view of an example of a portion of an embodiment of a semiconductor device in accordance with the present invention.

For simplicity and clarity of the illustration(s), elements in the figures are not necessarily to scale, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, and that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION OF THE DRAWINGS

As will be seen further hereinafter, a semiconductor device is formed to include a semiconductor material of a first conductivity type having a first surface and a second surface, and a first region of the semiconductor material that includes a second doping type. A gate structure of the device is formed in an opening that is in the first region with the opening extending into a portion of the semiconductor material that is underlying the first region. A gate conductor of the gate structure is within the opening. A gate insulator of the gate structure has a first portion of the gate insulator positioned between the gate conductor and a first portion of the semiconductor material. A shield conductor of the gate structure is within the opening and overlying the gate conductor. A shield insulator has a first portion positioned between the shield conductor and the gate conductor with the shield insulator having a second portion positioned between the shield conductor and a second portion of the gate insulator.

FIG. 1 illustrates an enlarged cross-sectional view of an example of a portion of an embodiment of an MOS transistor 50 that has an improved switching frequency, that is easier to manufacture, and that has a lower cost. Typically, transistor 50 includes an active region 51 and a termination region 52 that are illustrated in a general manner by arrows. A plurality of transistor cells are formed in the active region and are interconnected together to function as one transistor. Examples of the transistor cells are illustrated by transistor cells 55-57. Cells 55-57 typically are formed in long stripes that would extend perpendicular to the plane of the page of FIG. 1. Cells 55-57 may have other shapes in other embodiments such as a circular or other geometric shape. As is well known in the art, each of cells 55-57 function as a small transistor and are interconnected together to form one large transistor. As will be seen further hereinafter, in one embodiment, transistor 50 is formed as a vertical transistor that has lateral current flow in a channel region of transistor 50 and may have vertical current flow in other portions of transistor 50. This configuration assists in providing transistor 50 with a high operating frequency but still with a low Rdson of a vertical transistor. Additionally, transistor 50 has a low resistance for a shield conductor of the transistor which also improves the operating frequency of transistor 50.

Although the descriptions may focus attention on cells 56-57 and the nearby material, this is done for clarity of the descriptions and those skilled in the art will appreciate that the descriptions also apply to other cells of transistor 50 such as cell 55 and an adjacent cell (not shown) that may be positioned to the left of cell 55. As will be seen further hereinafter, each of cells 55-57 include a drain region, such as drain regions 61 and 62 that are illustrated in a general manner by arrows, and a gate structure, such as a gate structure 63 of cell 57 which is illustrated in a general manner by an arrow. Each gate structure, such as gate structure 63 for example, includes a shield conductor or shield, such as shields 88-90, overlying a gate conductor or gate, such as respective gates 80-82, with a shield insulator 85 insulating each shield from the corresponding gate. Transistor 50 is devoid of a shield conductor underlying any of gates 80-82 or positioned between any of gates 80-82 and the underlying channel region. Each of these features singularly and/or jointly facilitates forming a lower resistance for the shield conductors which results in a higher operating frequency for transistor 50. Each of cells 55-57 also includes a source region or source, such as sources 103 and 105 for example. A portion of the semiconductor material underlying regions 103 and/or 105 is configured to form a channel region of transistor 50, such as channel regions 59 and 60 which are illustrated in a general manner by arrows. The channel region of each cell underlies the corresponding gate, such as channel region 59 underlying gate 82, so that current flows laterally through the channel region, as illustrated in a general manner by an arrow 64, between the source region and the drain region of each cell. Those skilled in the art understand that the direction of the current, thus the arrow, depends on whether it is a P-channel or an N-channel transistor. Thus, the arrow may be opposite in other embodiments.

Transistor 50 may also include a gate contact structure 58 that is formed in region 52. Structure 58 may be formed in other areas in different embodiments, such as near a boundary with region 51. Those skilled in the art will understand that in most embodiments, gate contact structure 58 does not extend out of the plane of the page of FIG. 1 but that the illustrated view of structure 58 is at a point typically at the end of the trenches of gate structures 63. In other embodiments, there may be multiple versions of structure 58. The material of individual gates 80-83 typically are electrically connected to material 78 of structure 58 at some point, and gates 80-83 are later connected to each other such as by metal connections or by other conductors such as doped polysilicon.

FIG. 2-FIG. 6 illustrates various stages in portions of an example of an embodiment of a method of forming transistor 50. These descriptions have references to FIG. 1-FIG. 6. Although the descriptions of the methods herein may focus attention on openings 72-73 and the nearby material, this is done for clarity of the descriptions and those skilled in the art will appreciate that the descriptions also apply to other cells of transistor 50 such as cell 55 and an un-shown adjacent cell that may be positioned to the left of cell 55.

Figure 2:
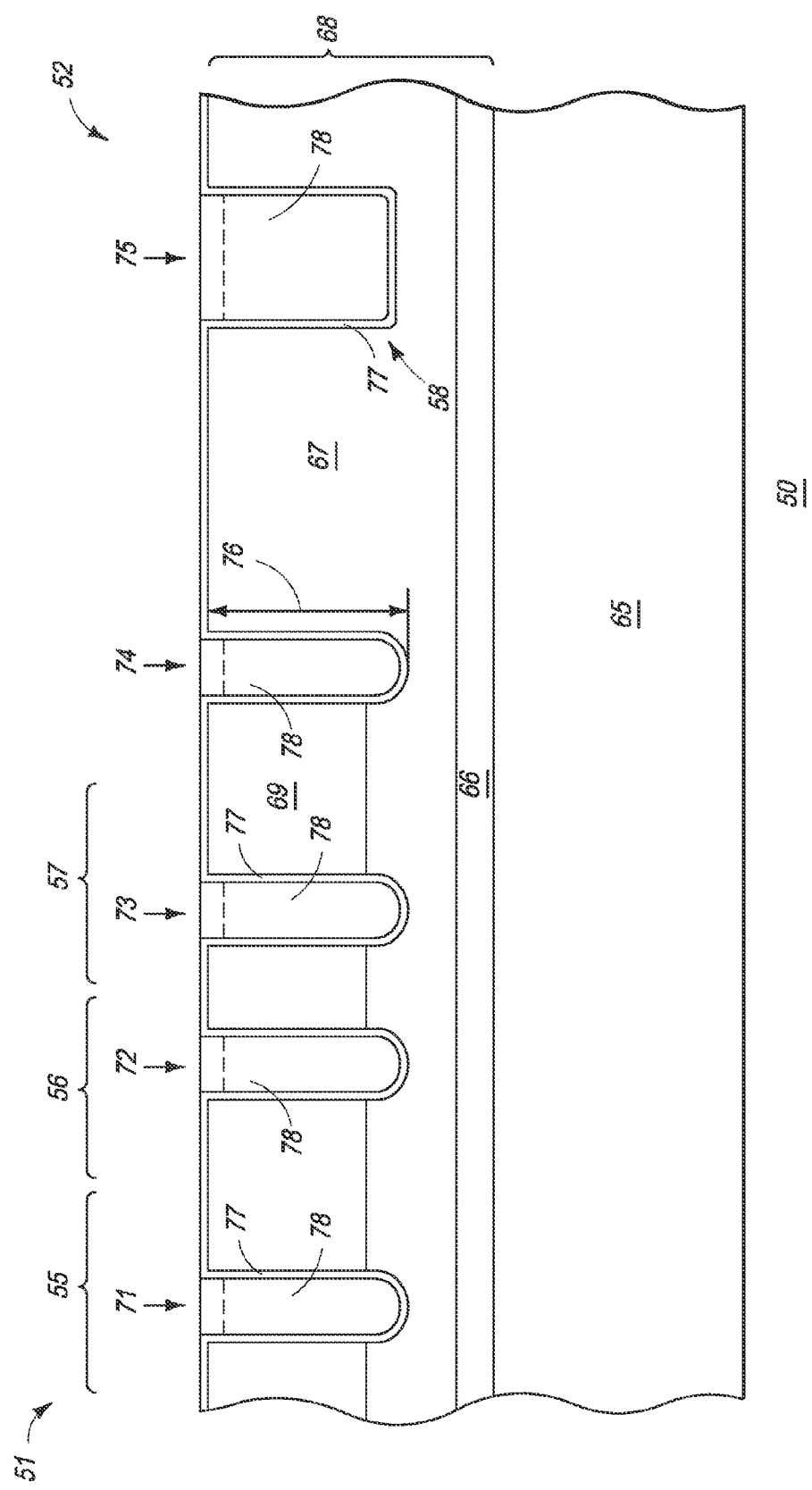
FIG. 2-FIG. 6 illustrate various stages in portions of an example of an embodiment of a method of forming the semiconductor device of FIG. 1 in accordance with the present invention.

Turning to FIG. 2, transistor 50 includes a semiconductor substrate 65 which typically has a high doping concentration in order to form a low resistance path for current flow for a vertical transistor. A layer 68 of semiconductor material is formed on substrate 65. One example of forming layer 68 of semiconductor material on substrate 65 includes forming an epitaxial layer 66 on one surface or a first surface of substrate 65 and forming an epitaxial layer 67 on layer 66. In other embodiments, one of layers 66 or 67 may be omitted. In one embodiment, substrate 65 may be highly doped N-type material. In another embodiment, layer 66 may be heavily doped P-type material which forms a body region for transistor 50 and layer 67 could be P-type material in which the channel region for transistor 50 is formed. In another embodiment, substrate 65 may be heavily doped P-type material and layer 66 may be omitted.

Openings 71-75 are formed to extend from a surface of layer 67 a distance 76 into layer 67. Distance 76 usually is chosen so that openings 71-74 extend through a semiconductor region 69. Openings 71-75 may be formed by a variety of methods including applying a mask, not shown, on layer 67 and etching openings into the material of layer 67. A gate insulator 77 is formed along the bottom and at least a portion of the sidewalls of the openings. In another embodiment, insulator 77 is formed along all of the sidewall of the opening and also on the surface of layer 67. Insulator 77 may be formed by a variety of methods. For example, the mask may be removed after forming openings 71-75 and the exposed silicon surface may be oxidized or insulator 77 may be formed by deposition techniques. In other embodiments, a portion of insulator 77 may be formed by oxidation and another portion may be formed by deposition.

A conductor material 78 is formed within openings 71-75. A portion of this conductor material will eventually form gates 80-83 within openings 71-74. Typically, openings 71-75 are filled with a doped polysilicon material. In other embodiments, a different conductor material may be used such as a silicide or a metal conductor.

In one embodiment, a portion of material 78 is removed from opening 75 so that the top of material 78 is recessed slightly below the surface of layer 67. In other embodiments, a portion of material 78 may be removed from all of openings 71-75 so that the top of material 78 is recessed in all of openings 71-75 as illustrated by dashed lines. In one embodiment, the portion of material 78 may be removed by applying a mask and etching the exposed portions of material 78.

Thereafter, semiconductor region 69 may be formed between the openings that are in active region 51 of transistor 50, such as between openings 71-74. Portions of region 69 will eventually form the drain regions of the cells, thus, the drain region for transistor 50. Region 69 may be formed by a variety of methods. In the preferred embodiment, a portion of layer 67 is doped in order to form region 69 within a portion of layer 67. In the preferred embodiment, transistor 10 is an N-channel transistor, thus, region 69 is an N-type region.

In an alternate embodiment, region 69 may be formed prior to forming openings 71-75. For example, an epitaxial layer may be grown on the surface of layer 67 with the desired conductivity type of region 69 and a portion of the epitaxial layer external to openings 71-74 may be counter doped to provide the conductivity and doping that is desired for the remainder of layer 67.

Figure 3:
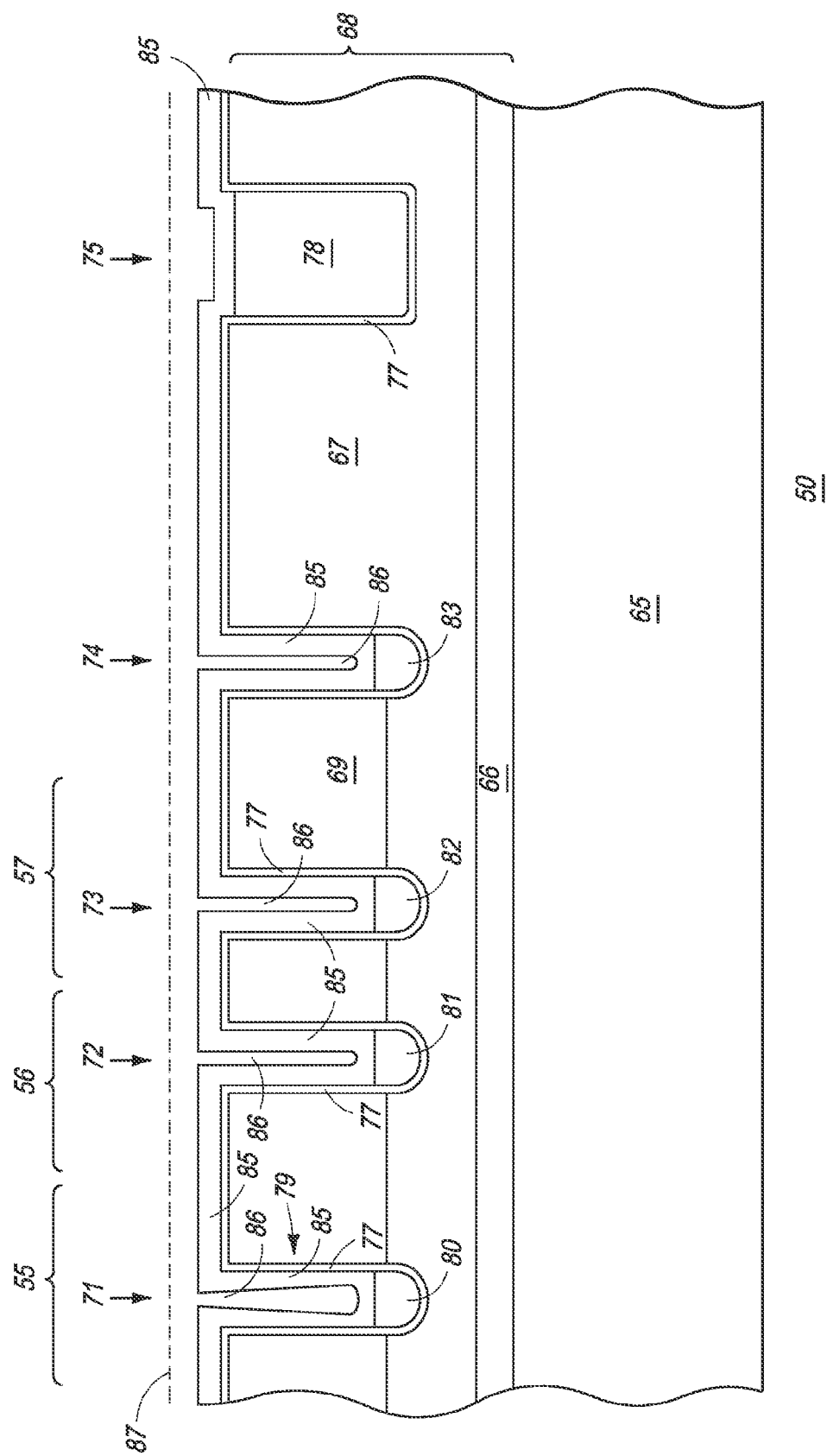

FIG. 3 illustrates a subsequent stage in an example of an embodiment of a method of forming transistor 50. A second portion of material 78 is removed from openings 71-74 leaving a third portion of material 78 near the bottom of openings 71-74 to form respective gates 80-83. Material 78 typically is not removed from opening 75 in termination region 52, although it may also be removed in other embodiments. In one embodiment, the portion of material 78 is removed by applying a mask, not shown, that exposes openings 71-74 but not opening 75, and etching the exposed material 78. In some embodiments, a protective layer may be included above material 78 in the event that excessive portions of insulator 77 would be removed while removing the second portion of material 78. The protective layer may be silicon nitride or some other type of protective material.

Subsequently, a shield insulator 85 is formed in openings 71-74 and overlying respective gates 80-83 so that a portion of insulator 85 is between gates 80-83 and shield conductors 88-91 (see FIG. 1). The thickness of insulator 85 typically is greater than the thickness of insulator 77 so that the thickness of the insulator between gates 80-83 and shields 88-91 is thicker than the thickness of the gate insulator portion of insulator 77 that underlies gates 80-83. In other embodiments, insulator 85 may not be thicker than insulator 77. In another embodiment, the thickness of insulator 85 may be formed to have a thickness near the surface of region 69 and to decrease in thickness as insulator extends into region 69 toward one of or each of gates 80-83. One example embodiment is illustrated by gate structure 79, identified in a general manner by an arrow. The tapering of insulator 85 will assist in selecting the doping concentration of layer 67 to achieve low Rdson. For example, insulator 85 may be tapered to have a thickness that decreases for at least a portion of a distance that insulator 85 extends into region 69 or into opening 71. In other embodiments, the width of opening 71 may be formed to narrow as opening 71 extends into region 69. Although structure 79 is illustrated to have a taper that extends away from a straight line at an angle, the taper could have various other shapes. For example, the taper may extend as a series of steps with rounded or rectangular corners, or may extend away with a curved shape. Additionally, the opening within insulator 85 may have a different such as closer to having straight sidewalls within the opening. In such an embodiment, the sidewalls of opening 71 may have a similar taper so that the opening within insulator 85 has straighter sidewalls or the thickness of insulator 77 may taper, or insulator 77 may be omitted. In another embodiment, the sidewalls of structure 79 may be formed to slope such as in a "V" shape or a "V" shape with a flattened bottom other shape where the sidewalls extend away from the surface of region 69 at an angle other than ninety (90) degrees. The shape of insulator 85 within opening 71 optionally may be used for any of insulators 85. Although this optional embodiment is illustrated only in FIG. 3, it may be maintained as the shape of any or all of insulators 85 for resulting transistor 50.

Insulator 85 usually is also formed on conductor 78 in opening 75. In the preferred embodiment, insulator 85 is formed by depositing a layer of tetraethyl orthosilicate glass (TEOS) and annealing it. Insulator 85 may be other materials in other embodiments. Insulator 85 is formed on gates 80-83 and along the sidewalls of openings 71-74 leaving an opening 86 in insulator 85. In other embodiments, insulator 85 may be formed by other techniques such as forming an insulator in the openings and then etching another opening within the insulator. In other embodiments, insulator 85 may not be formed along the entire remaining length of the sidewall of the openings.

Figure 4:
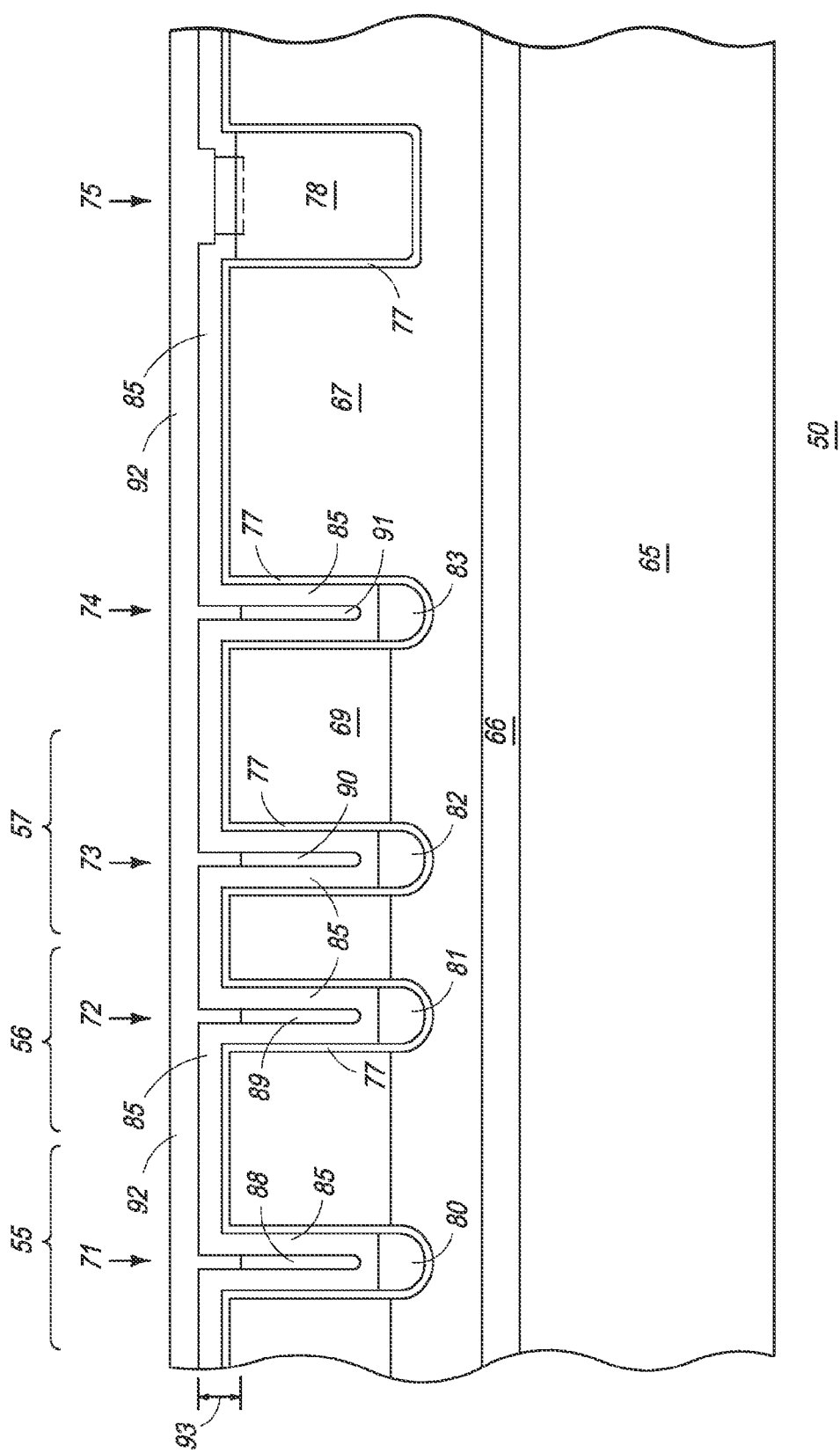

FIG. 4 illustrates transistor 50 at a subsequent stage in an example of an embodiment of a method of forming transistor 50. Shield conductors 88-91 are formed within openings 86 above respective gates 80-83. In one embodiment, a layer of doped polysilicon is formed on insulator 85 and within openings 86 (such as illustrated by dashed line 87 in FIG. 3). Subsequently, the layer of doped polysilicon may be etched to remove the polysilicon from the surface of transistor 50 and to remove a portion of the polysilicon material within openings 86 thereby recessing the top of conductors 88-91 a distance 93 below the surface of insulator 85. Typically, the top of conductor 88-91 is at least no higher than the surface of layer 67 but may be other heights in other embodiments. Subsequently, another insulator 92 may be formed in the remainder of openings 86 and on conductors 88-91 to cap the top of and insulate the top of conductors 88-91. Insulator 92 usually is also formed over opening 75.

Figure 5:
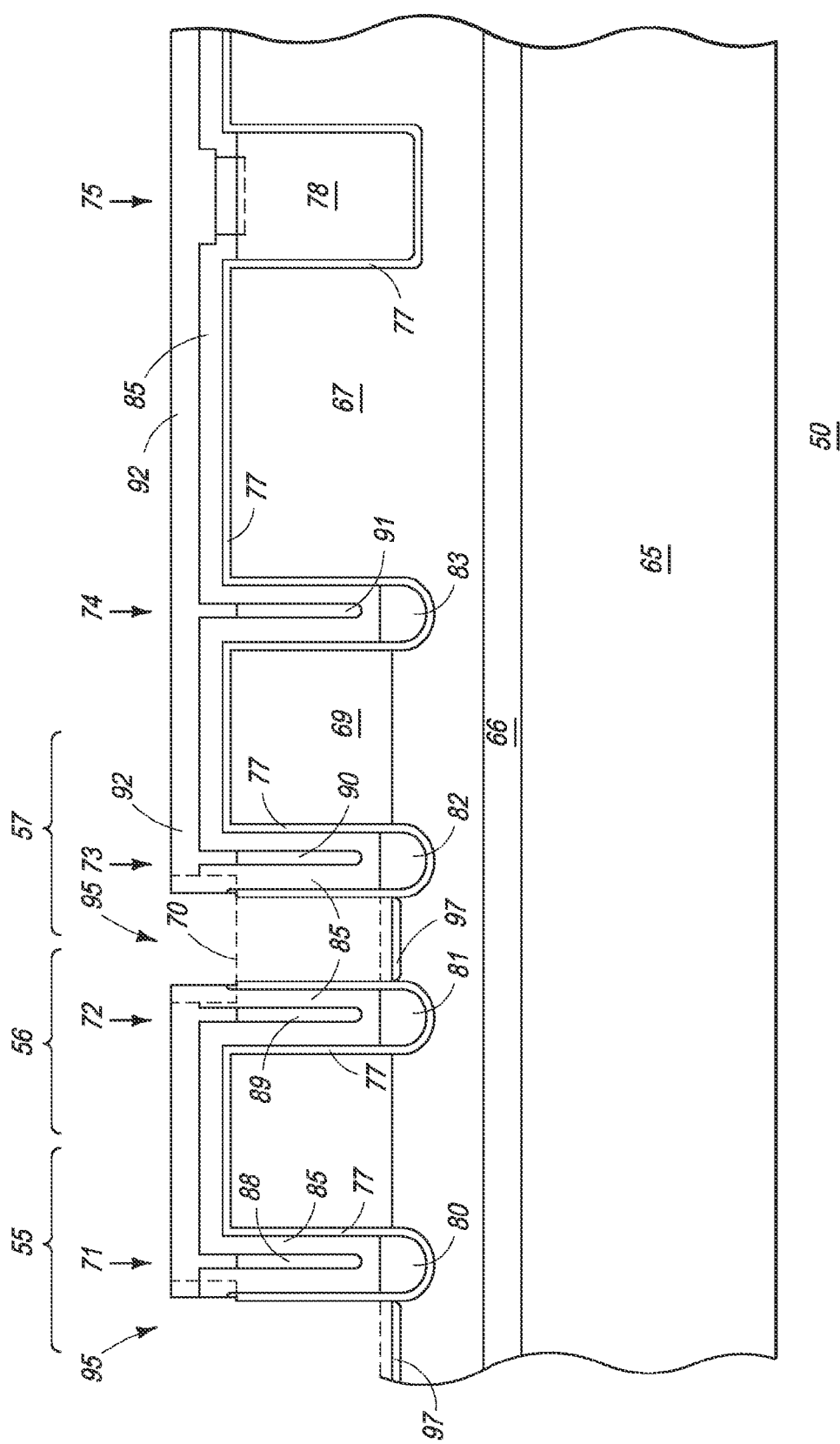

FIG. 5 illustrates transistor 50 at another subsequent stage in an example of an embodiment of a method of forming transistor 50 where transistor 50 is prepared for forming source regions between every other cell such as between cells 56 and 57, and between cell 55 and the adjacent cell (not shown). A portion of the surface of region 69 is exposed between cells 56 and 57, thus, between openings 72-73. A master source region 97 is formed on the surface of layer 67 adjacent openings 72-73 (and adjacent opening 77 and the adjacent opening, not shown). In the preferred embodiment, a portion of insulators 92, 85, and 77 are removed in-between openings 72 and 73 to expose the surface of region 69, illustrated by a dashed line 70. In one embodiment, a mask not shown, may be applied and patterned to expose the portion of insulator 92 that is between openings 72 and 73. The mask opening may overlie a portion of insulator 92 and may also overlie a portion of insulator 77 and 85 that is between shield conductors 88 and 89, as illustrated by vertical sides of dashed line 70. The exposed portion of insulators 92, 85, and 77 are removed to form an opening 95. Opening 95 exposes the surface of region 69 and adjacent portions of insulators 77 and 85. In other embodiments, opening 95 may be formed to expose the surface of region 69 but not expose conductors 88-89. Subsequently, the exposed portions of insulators 92, 85, and 77 are etched through to remove the exposed portions thereof. Subsequently, the exposed portion of the surface of region 69 is removed to expose the surface of layer 67 that underlies opening 95. Insulators 85 and 77 may form a portion of the mask for this operation. In one embodiment, the material of region 69 is etched with a process that etches silicon but not the material used for insulators 77, 85, and 92. In some embodiments, some portion of region 69 may remain on the surface of layer 67 within opening 95.

The exposed portion of region 67 (and any remaining portion of region 69) is doped to form master source region 97 on the surface of region 67. Region 97 usually extends to abut insulators 77 on adjacent walls of opening 72 and 73. In the preferred embodiment, the surface of region 67 is doped, such as through an implant operation, so that region 97 has a higher doping concentration and the same conductivity type as the material of region 69. Although region 97 is illustrated as not underlying gates 81 or 82, in some cases the region 97 may diffuse to underlie at least a portion of one of or both of gates 81-82.

Figure 6:
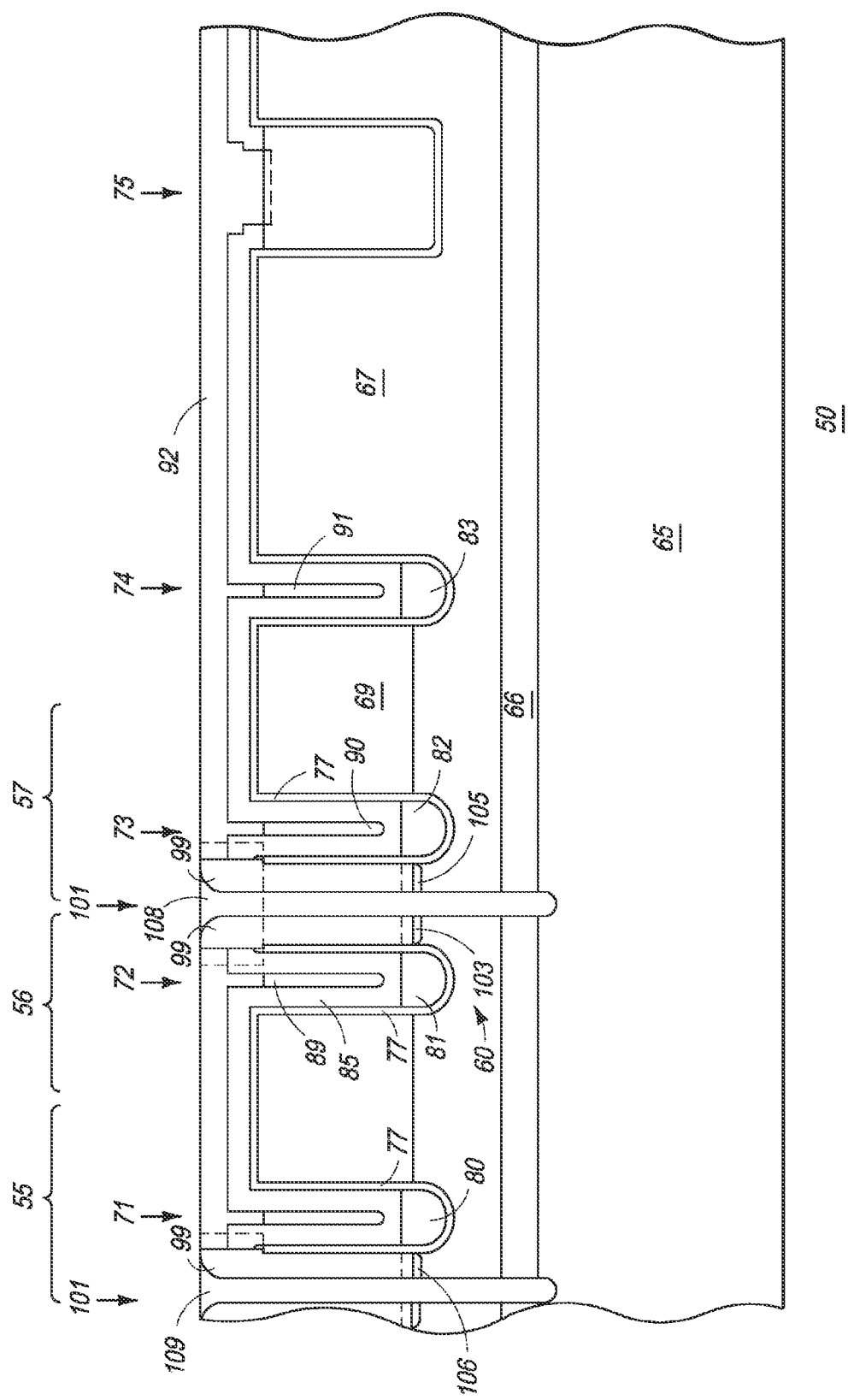

FIG. 6 illustrates another stage in an example of an embodiment of a method of forming transistor 50. An insulator 99 is formed within opening 95 (FIG. 5) around the sidewalls of opening 95 so that an opening 101 is formed within insulator 99. Opening 101 exposes a portion of the surface of source region 97 (FIG. 5). In the preferred embodiment, insulator 99 is formed by depositing a TEOS layer, for example by low-pressure chemical vapor deposition (LPCVD), so that opening 101 is formed within the material formed for insulator 99. In other embodiments, other techniques may be used to form insulator 99 including forming a blanket insulator, forming opening 101 within the insulator, and removing excess portions of the insulator that may be on the lateral surface of transistor 50. A spacer etch process may be used to remove horizontal portions of the insulator material used to form insulator 99 thereby leaving the portions of insulator material within opening 95 as insulator 99.

Opening 101 through insulator 99 exposes the surface of region 97. Opening 101 is extended by removing the exposed portion of region 97 and underlying portions of layers 67 and 66 through opening 101. Opening 101 is extended to extend at least through layers 66 and 67. In an embodiment for a vertical transistor, opening 101 could extend into substrate 65 in order to form a low resistance connection to the source for transistor 50. Extending opening 101 through region 97 forms region 97 into source regions or sources 103 and 105 so that cell 56 has source 103 and cell 57 as source 105. Source 103 is proximal to gate 80. Alternately, source 103 may be formed adjacent to and spaced apart from gate 80 at least by the distance of insulator 77.

Subsequently, a source conductor 108 may be formed within opening 101 so that conductor 108 forms a low resistance ohmic electrical contact to source regions 103 and 105, to layers 66 and 67, and optionally to substrate 65. Typically, conductor 108 fills opening 101. It is preferable that the material used for conductor 108 is suitable to form a low resistance ohmic contact to both P-type and N-Type semiconductor material, this reduces the manufacturing costs for transistor 50. However, other methods may be used to form the ohmic contacts such as using a highly doped contact region in one or all of the semiconductor regions that contact conductor 108. In one embodiment, tungsten is used for conductor 108. In the preferred embodiment, a titanium layer with titanium nitride and tungsten fill material is used for conductor 108. Typically, the fill material is blanket deposited to fill opening 101 and cover the surface of insulator 92. In other embodiments, other conductors may be used as long as the conductor material forms an ohmic contact to P-type and N-type semiconductor material. A planarization step may be used to substantially remove the material of conductor 108 from the horizontal surface of insulator 92.

Referring back to FIG. 1, the source conductor is enlarged to also form an ohmic electrical connection to shield conductors 89-90. Also, drain conductors 113 and 115 are formed for transistor 50. Drain contact regions 112 and 114 may be formed in respective drain regions 61 and 62 of the material of region 69 to facilitate forming a low resistance electrical contact to the material of region 69 that forms drain regions 61 and 62. Openings may be formed through insulators 92, 85, and 77 overlying the portion of the material of region 69 that forms drain regions 61 and 62. Openings may also be formed at the same time for forming conductor 119 and for enlarging source conductor 108 to include additional source conductor portion 118. The opening for portion 118 should be sufficient to expose a portion of shield conductors 88 and 90 and a portion of conductor 108. For example, a mask may be applied to insulator 92 and patterned with openings that overlie the selected locations. The underlying portions of insulators 92, 85, and 77 may be removed from the openings.

The exposed surface of region 69 may be doped to form highly doped drain contact regions 112 and 114 within respective drain regions 61 and 62 in order to facilitate forming an ohmic contact to the material of region 69. In an optional embodiment, another mask may or may not be used to block the dopants from the openings that were formed for portion 118 and conductor 119. Optionally, material 78 within structure 58 may also be doped to form a contact region as illustrated by dashed lines.

Subsequently, a conductor material may be applied to fill the openings formed through insulators 92, 85, and 77 to enlarge source conductor 108 to include portion 118 and to form drain conductors 113 and 115 and termination conductor 119. Portion 118 forms an ohmic electrical contact to the material of shields 89 and 90 thereby forming a low resistance electrical connection between shields 89 and 90, source conductor 108, and sources 103 and 105. For the embodiment where conductor 108 contacts substrate 65, the low resistance connection also includes substrate 65. The low resistance electrical connection reduces the shield electrode resistance of transistor 50 and reduces the shield capacitance which improves the switching frequency of transistor 50.

In the preferred embodiment, a drain electrode 120 may be formed to facilitate electrically connecting the drain regions of transistor 50 to external connections such as package terminals or for connection to other devices. Also in the preferred embodiment, a source conductor 53 may be applied to a second surface of substrate 65 to form transistor 50 as a vertical transistor. For this configuration, conductor 53 forms a low resistance current flow path. Even in such a configuration, current flow in the channel region is laterally underlying the gate conductors such as gates 80-82 as illustrated by arrow 64. For such a configuration, the source conductor of conductor 108 and portion 118 still provide a low resistance connection to shield conductors 89-90. For other embodiments, such as for a lateral transistor configuration, conductor 53 may be omitted and a source electrode 122 may be formed to facilitate electrically connecting the source regions of transistor 50 to external connections such as package terminals or for connection to other devices.

In another embodiment, transistor 50 may be formed to have an even lower Rdson by omitting the portion of insulator 85 that is shown between gates 80-83 and shields 88-91 such that shields 88-91 are electrically connected to gates 80-83, respectively. This configuration may reduce the Rdson but also may lower the switching frequency of transistor 50.

Figure 7:
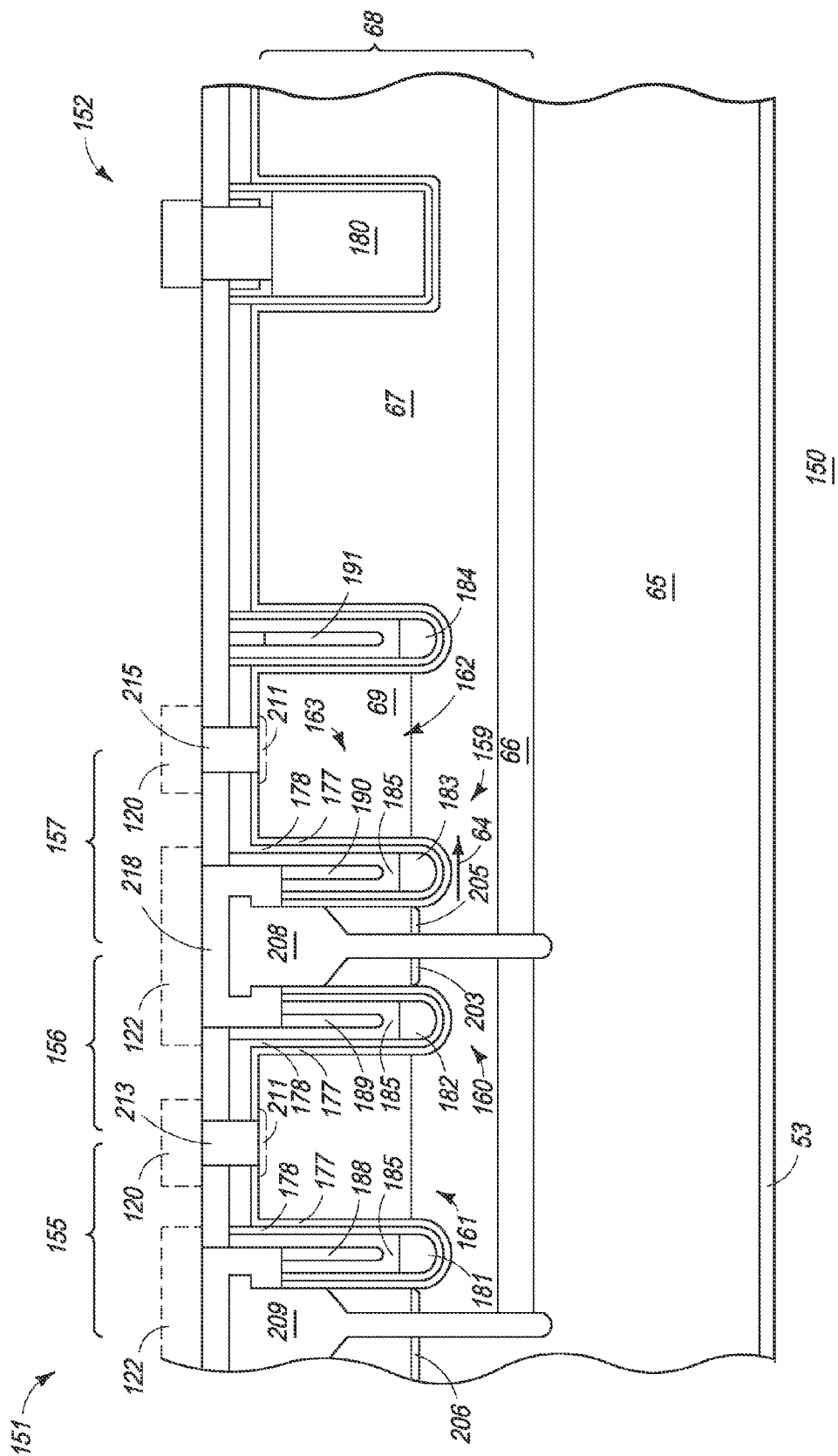
FIG. 7 illustrates an enlarged cross-sectional view of another semiconductor device that is an alternate embodiment of the semiconductor device described in the description of FIGS. 1-6 in accordance with the present invention.

FIG. 7 illustrates an enlarged cross-sectional view of a transistor 150 that is an alternate embodiment of transistor 50 that was explained in the description of FIG. 1-FIG. 6. Transistor 150 includes an active region 151 and a termination region 152 that are similar to regions 51 and 52 of transistor 50 and are illustrated in a general manner by arrows. A plurality of transistor cells 155-157 are similar to cells 55-57 except that cells 155-157 have a source conductor 208 that is slightly different than source conductor 108 and have a gate structure 163, illustrated in a general manner by an arrow, that has an insulator configuration that is formed in a different manner than gate structure 63. Transistor 150 has drain regions 161 and 162, illustrated in a general manner by arrows, that are similar to regions 61 and 62 of transistor 50.

Gate structures 163 include a shield conductor or shield, such as shields 188-191 that are similar to shields 88-91, overlying a gate conductor or gate, such as gates 181-184 that are similar to respective gates 80-83. Each of cells 155-157 also includes a source region, such as source regions 203 and 205 for example that are similar to respective regions 103 and 105. The channel region of each cell underlies the corresponding gate, such as channel region 159 underlying gate 183, so that current flows laterally through the channel region. Although the descriptions may focus attention on cells 156-157 and the nearby material, this is done for clarity of the descriptions and those skilled in the art will appreciate that the descriptions also apply to other cells of transistor 150 such as cell 155 and an adjacent cell (not shown) that may be positioned to the left of cell 155.

FIG. 8-FIG. 14 illustrate various stages in portions of an example of an embodiment of a method of forming transistor 150. These descriptions have references to FIG. 7-FIG. 14.

Figure 8:
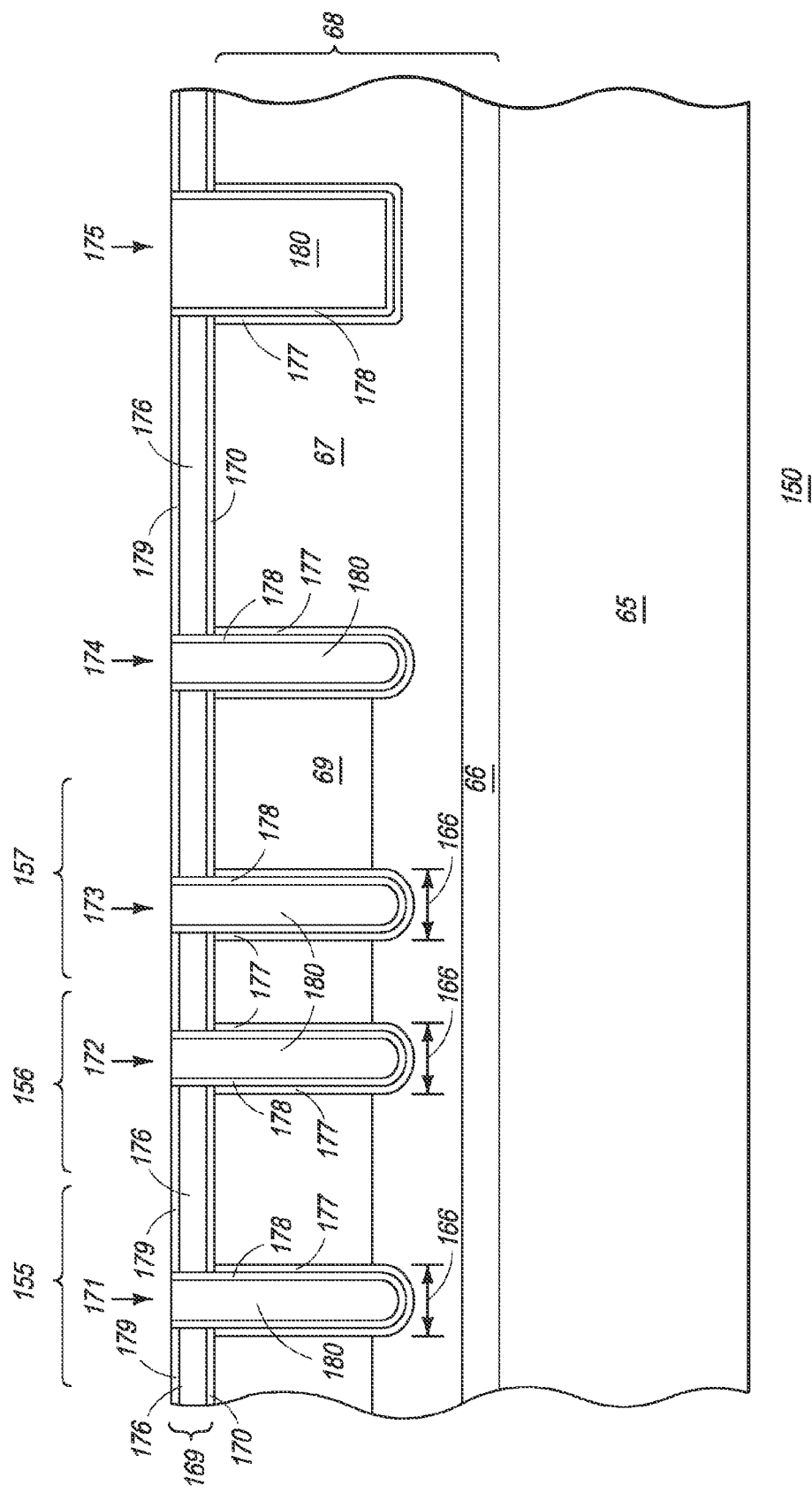
FIG. 8-FIG. 14 illustrate various stages in portions of an example of an embodiment of a method of forming the semiconductor device of FIG. 7 in accordance with the present invention.

Referring now to FIG. 8, region 69 is formed prior to forming any openings within layer 68 of semiconductor material. During this operation, a first insulating layer 170 typically is formed on the surface of region 69 and layer 67. Subsequently, a protective layer 176 is formed on layer 170. The material of layer 176 is material that is not etched by operations that etch layer 170. Another insulator layer 179 is formed on layer 176. The material of layer 179 typically is a material that is not etched by operations that etch layer 176. In the preferred embodiment, layer 176 is silicon nitride and layers 170 and 179 are silicon dioxide (referred to as oxide). For example, layer 170 may be an oxide layer that is formed during the formation of region 69. Layer 179 may be a layer of TEOS that is formed on layer 176. The material of layers 170, 176, and 179 may be other insulating materials in other embodiments. Layers 170, 176, and 179 will be used as a hard-mask or mask 169 for forming other elements of transistor 150.

Thereafter, openings 171-175 are formed through the layers of mask 169. Mask 169 is used to extend a depth of openings 171-175 into the material of region 69. Typically, the process of extending the depth of openings 171-175 causes a width 166 of openings 171-175 to be wider than the width of the opening formed through mask 169 so that openings 170-175 undercut the semiconductor material from under a portion of layer 170.

A first insulator 177 is formed along the sidewalls and bottom of openings 171-175. Subsequently, a second insulator 178 may be formed on insulator 177. In the preferred embodiment, insulator 177 is formed by oxidizing exposed portions of the semiconductor material within openings 171-175 so that insulator 177 fills the space underlying layer 170. Insulator 178 may be formed by depositing insulator material within openings 171-175. For example insulator 178 may be formed from TEOS. In another embodiment, insulator 178 may be formed by depositing a different insulating material and forming an opening within the material to retain an opening within insulator 178. As will be seen further hereinafter, insulators 177-178 form the gate insulator for transistor cells 155-157.

A conductor material 180 is formed within the remaining portions of openings 171-175. Conductor material 180 is similar to material 78. Portions of material 180 may be formed on the surface of mask 169 and may be removed such as by CMP or an etching procedure or other equivalent procedure. A portion of conductor material 180 may be removed in order to recess the top of material 180 within openings 171-175 similarly to material 78 in FIG. 2. This procedure is mainly for opening 175, therefore, in other embodiments openings 171-174 may not be affected by this operation.

Figure 9:
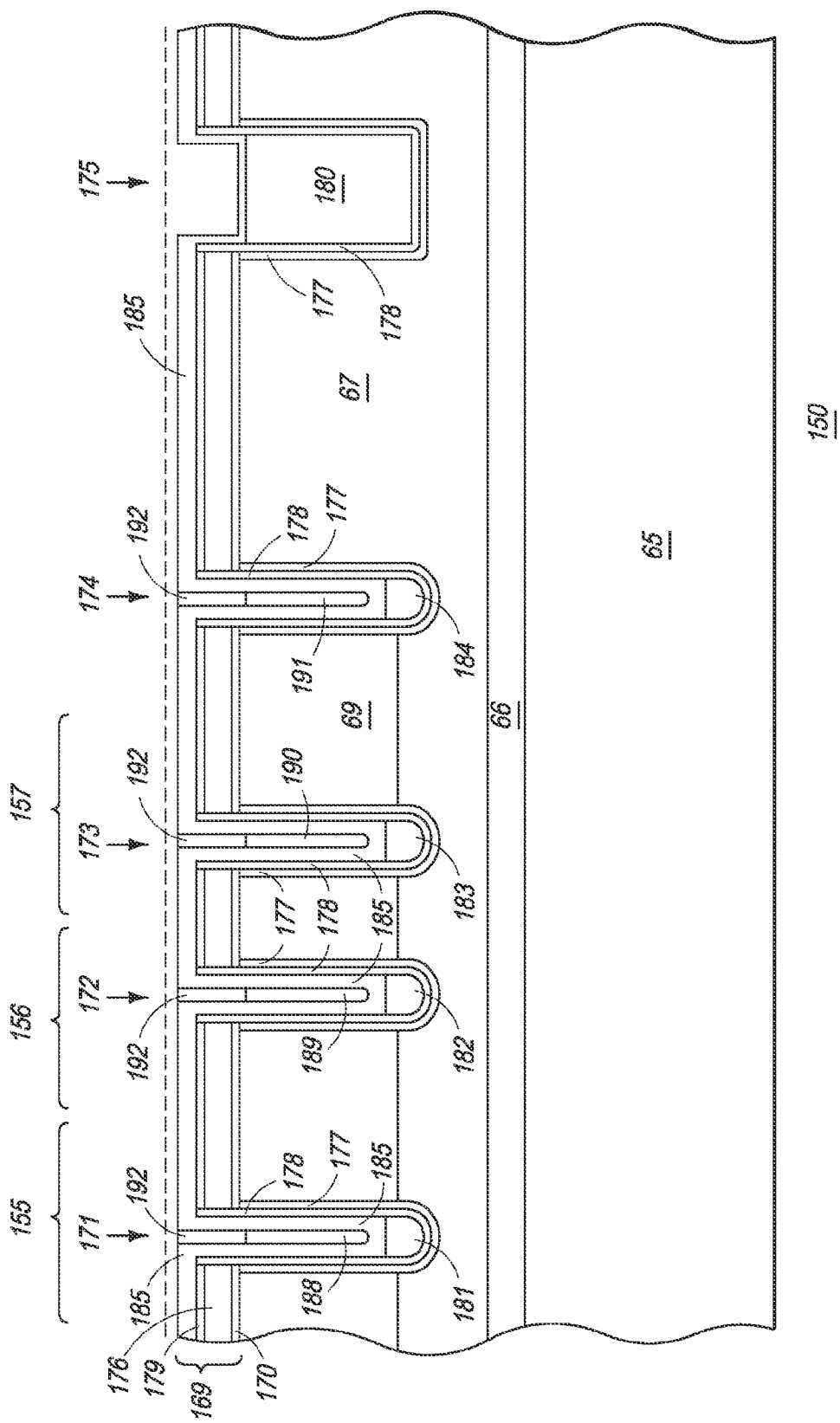

FIG. 9 illustrates a subsequent stage in the example of an embodiment of a method of forming transistor 150. A portion of material 180 within openings 171-174 is removed to form gate conductors 181-184 within respective openings 171-174 and overlying portions of layer 67. Typically, a mask, not shown, is applied to protect opening 175 while material 180 within openings 171-174 is removed through the openings in mask 169 to reduce the height of material 180 resulting in conductors 181-184.

A shield insulator 185 is formed within openings 171-175. Insulator 185 is formed similarly to insulator 85 that is explained in the description of FIG. 3. Insulator 185 typically is also formed on material 180 within opening 175. Shield conductors 188-191 are formed within the openings of insulator 185. Conductors 188-191 are formed similar to conductors 88-91 that are explained in the description of FIG. 3-FIG. 4.

Subsequently, a shield cap 192 is formed within openings 171-174 to insulate the top portions of conductors 188-191. Cap 192 may be formed by applying an insulator layer 193 (illustrated by a dashed line) onto mask 169 similar to insulator 92 that was explained in the description of FIG. 4.

Figure 10:
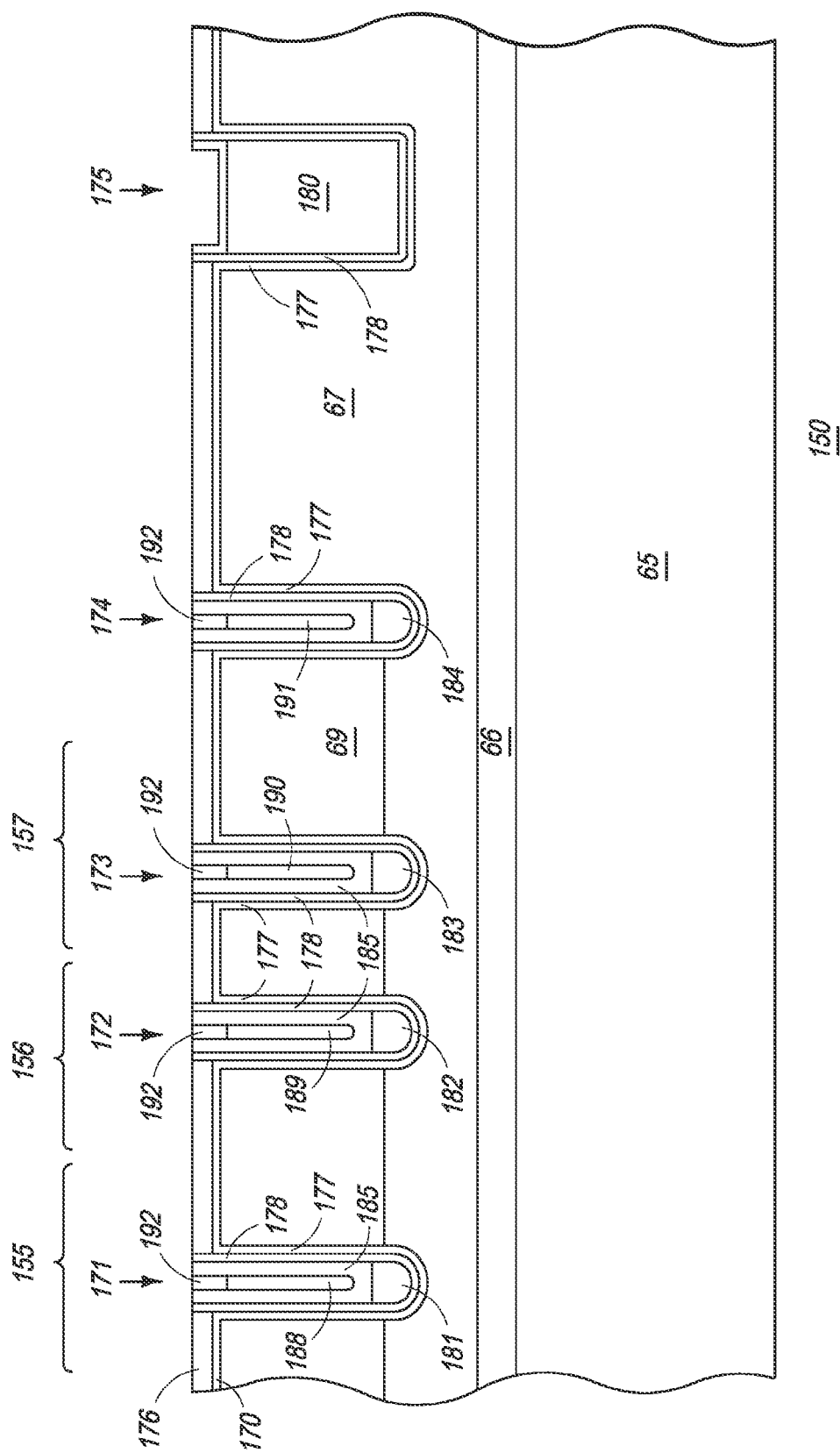

FIG. 10 illustrates transistor 150 at another subsequent stage. Portions of insulator layer 193 that are not within openings 171-174 are removed along with portions of insulator 185 and 179 that also are not within openings 171-174. During the process of removing the insulating layer to leave cap 192, the horizontal portions of insulator 185 and 179 or removed to expose layer 176.

Figure 11:
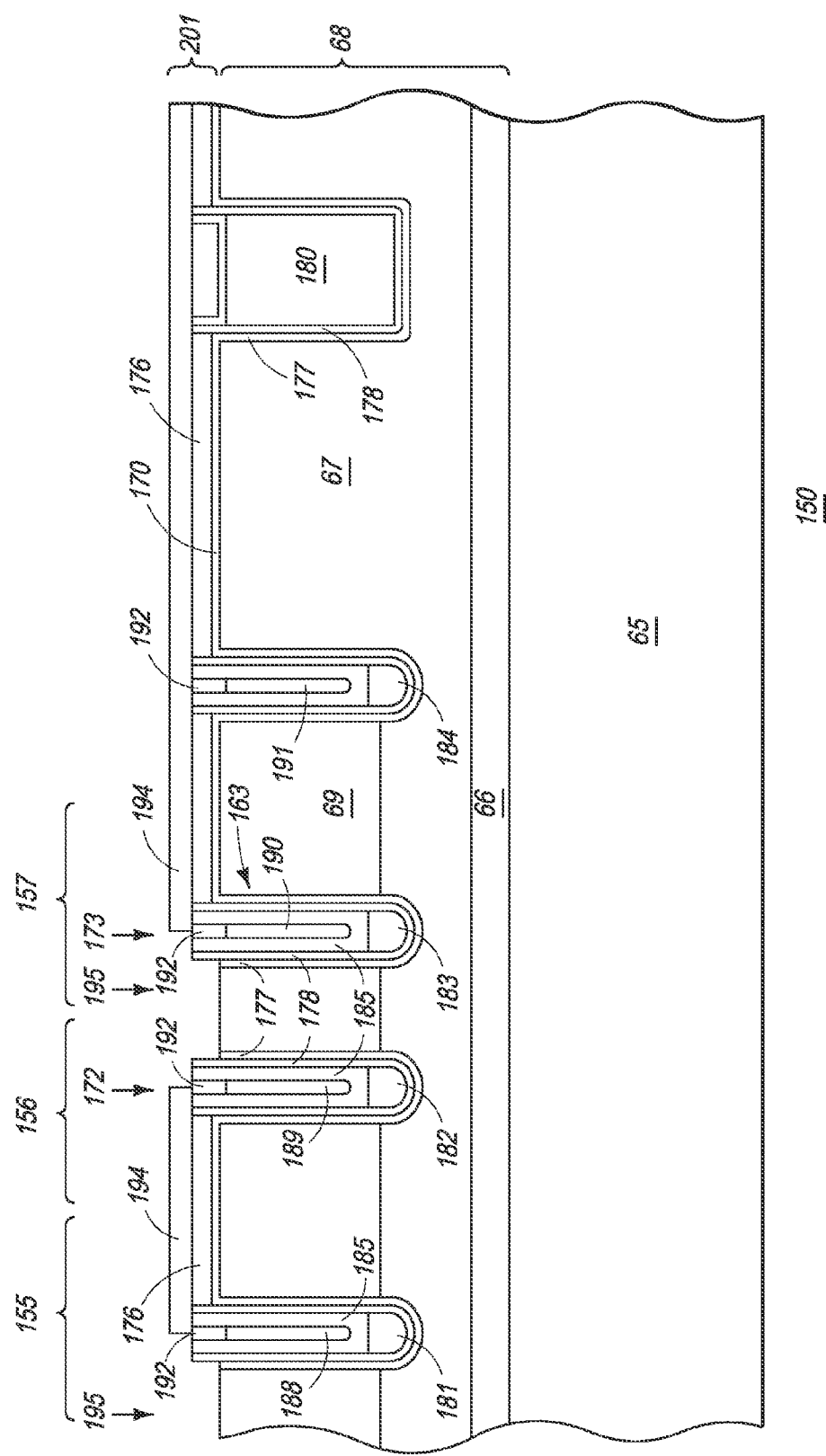

FIG. 11 illustrates another subsequent stage in the example of an embodiment of a method of forming transistor 150. Another insulator layer 194 is formed on layer 176 to assist in forming another hard mask or mask 201. The material for layer 194 is similar to the material used for insulator 185. An opening 195 is formed in the portion of layer 194 that overlies the region where a source is to be formed for cells 155-157. Opening 195 overlies the region between openings 172 and 173 that overlies where sources 203 and 205 are to be formed. Opening 195 also overlies at least a portion of both shields 189 and 190. Typically, a photomask, not shown, is pattern with an opening where opening 195 is to be formed, the exposed portions of layer 194 are removed, and the photomask is subsequently removed. Thereafter, mask 201 is used to remove the exposed portions of layer 176, and the exposed portions of layer 170 are removed to expose the surface of region 69 that is between openings 172 and 173. The underlying portions of region 69 are also removed to expose the surface of layer 67 in order to facilitate forming source regions for transistor 150.

Figure 12:
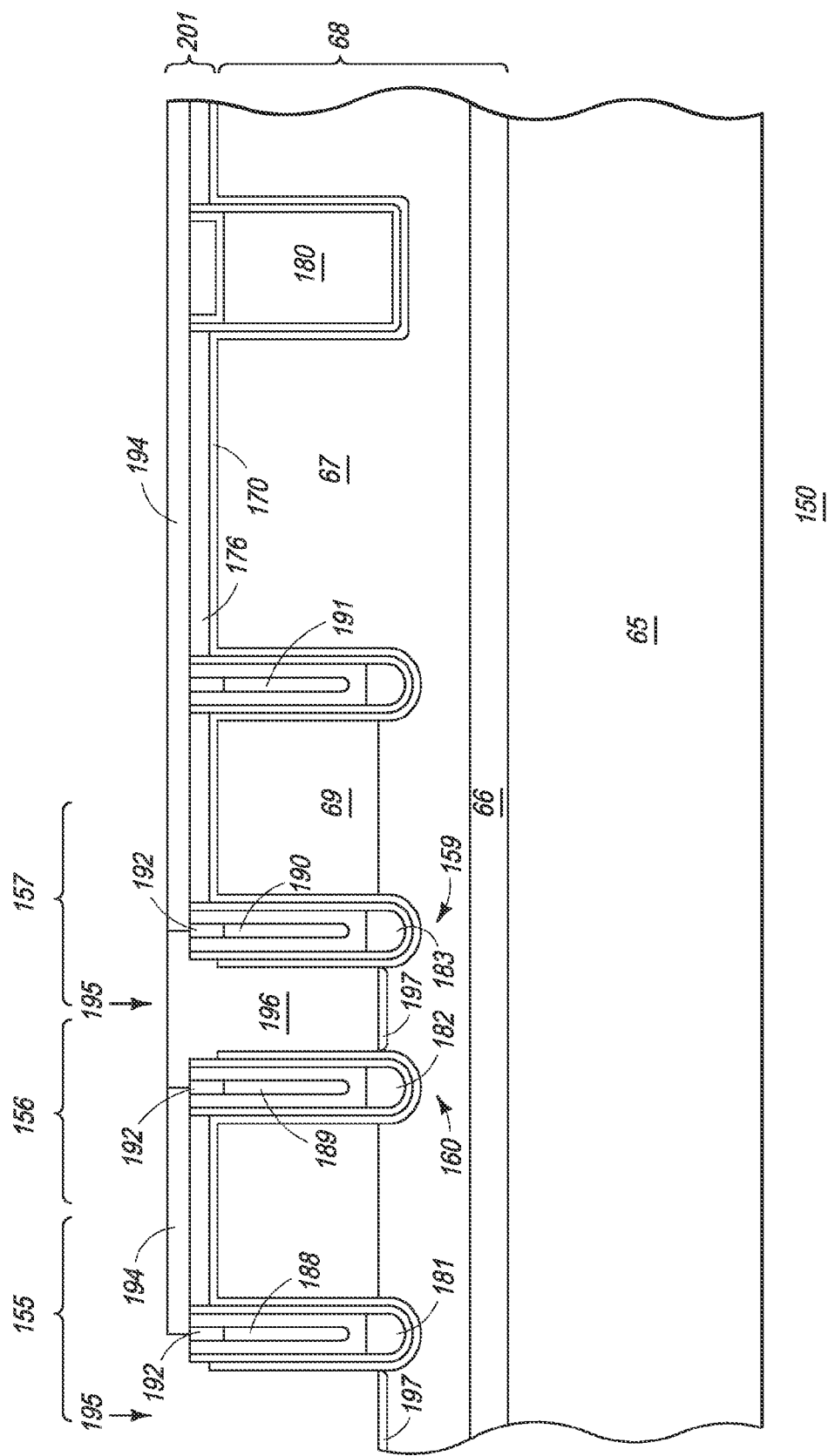

FIG. 12 illustrates another subsequent stage in the example of an embodiment of a method of forming transistor 150. A doped semiconductor material 196 is formed within opening 195. Material 196 does not necessarily have to fill opening 195 but in some embodiments may fill opening 195 as illustrated in FIG. 12. Thereafter, dopants from material 196 are diffused into layer 67 to form a master source region 197. Region 197 is formed adjacent to gate conductors 182-183 but separated therefrom by the gate insulator formed by insulators 177-178. Those skilled in the art understand that in another embodiment, the exposed portion of layer 67 (illustrated in FIG. 11) may be doped in order to form master source region 197 instead of forming region 197 from doped conductor material 196. Alternately material 196 may be formed within a portion of opening 195 to form region 197, and thereafter, another semiconductor material may be used to fill the remainder of opening 195.

Figure 13:
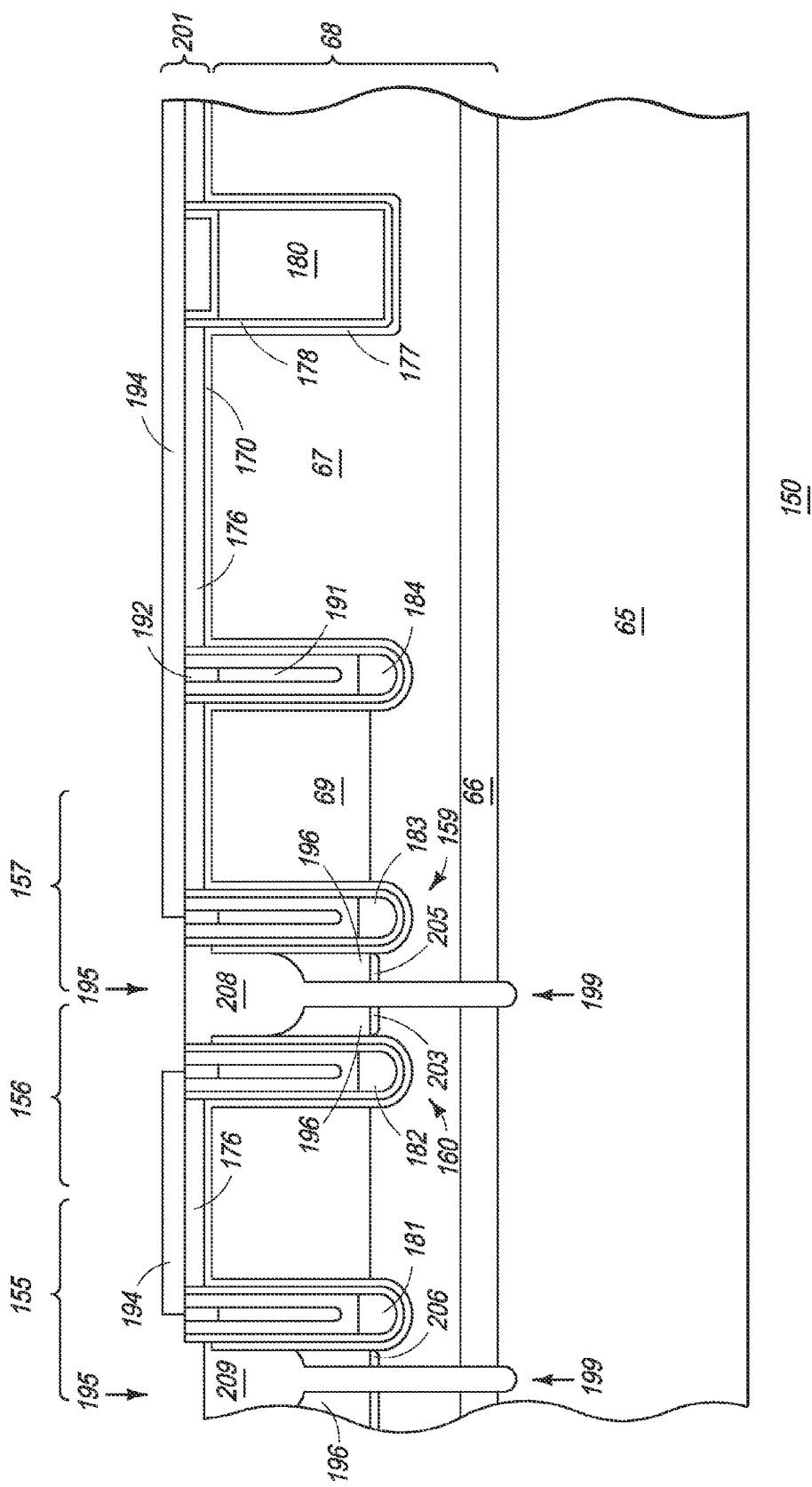

FIG. 13 illustrates another stage in the example of an embodiment of a method of forming transistor 150. An opening 199 is formed through material 196 and to extend through region 197 and layers 67 and 66 to expose the surface of substrate 65. In most embodiments, opening 199 may extend a distance into substrate 65. Opening 199 separates region 197 into two separate source regions 203 and 205 for respective cells 156 and 157. A source conductor 208 is then formed within opening 199 to form an ohmic electrical connection to source regions 203 and 205 and layers 66-67, and to substrate 65 for the embodiment where opening 199 extends to substrate 65.

Figure 14:
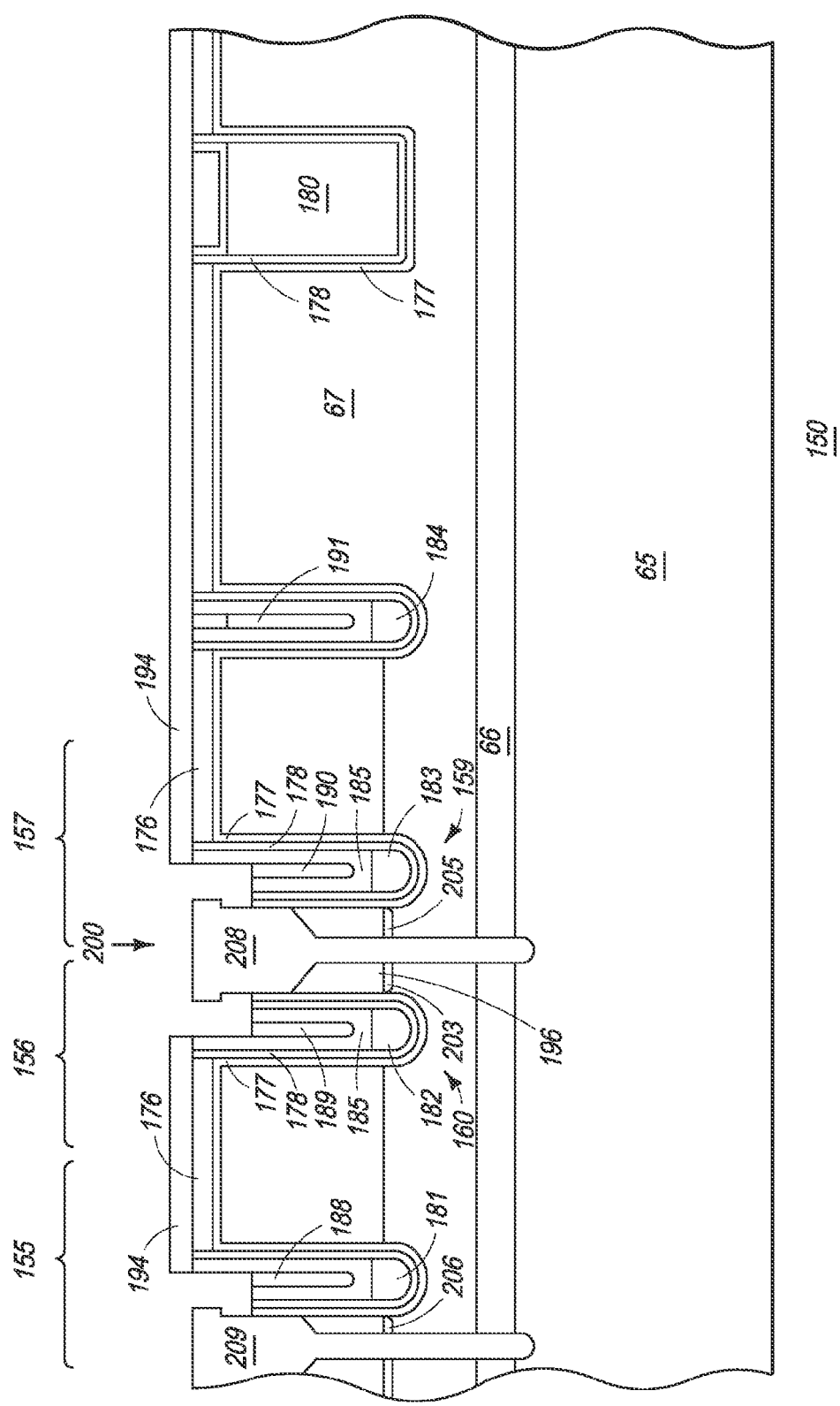

FIG. 14 illustrates another subsequent stage in the example of an embodiment of a method of forming transistor 150. Another opening 200 may be formed to expose a top portion of conductors 189-190 and to remove the portion of insulators and 177, 178, and 185 that are laterally between conductor 208 and adjacent conductors 189-190.

Referring back to FIG. 7, source conductor 208 is enlarged to include a source conductor portion 218 that expands conductor 208 to electrically connect to conductors 189-190. Additionally, openings may be formed overlying a portion of drain regions 161 and 162 to facilitate forming drain conductors 213 and 215 to the drain regions of cells 155-157. These openings may alternately be formed at the same time as openings 200 or may be formed after forming portion 218. Conductors 213 and 215 are similar to conductor 113 and 115 (FIG. 1) and may be formed similarly thereto. An additional opening may be formed overlying material 180 in termination region 152 to form electrical connection thereto. In some embodiments, a drain contact region 211 may be formed within drain regions 161-162 to facilitate forming electrical connection to the material and within region 69. The source conductor, including conductor 208 and portion 218, forms a low resistance ohmic electrical connection between sources 203 and 205 and respective shield conductors 189 and 190.

Figure 15:
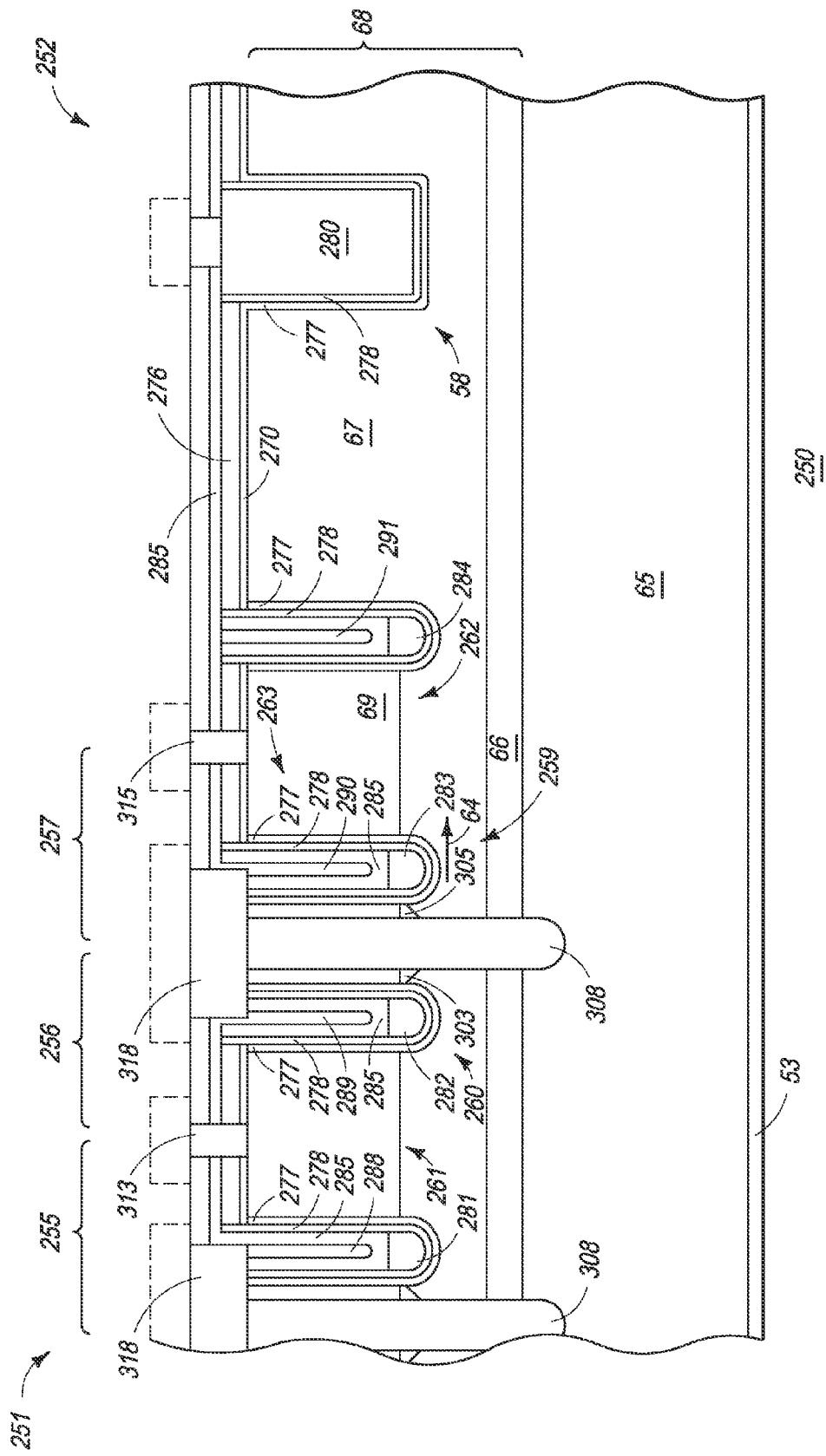
FIG. 15 illustrates an enlarged cross-sectional view of another semiconductor device that is an alternate embodiment of the semiconductor device described in the description of FIGS. 1-14 in accordance with the present invention.

FIG. 15 illustrates an enlarged cross-sectional view of a portion of an example of an embodiment of a transistor 250 that is an alternate embodiment of transistors 50 and 150 that were explained in the description of FIG. 1-FIG. 14. Transistor 250 includes an active region 251 and a termination region 252 that are similar to regions 151 and 152 of transistor 150 and are illustrated in a general manner by arrows. A plurality of transistor cells 255-257 are similar to cells 155-157 except that cells 255-257 have a gate structure 263 that is formed differently. Cells 255-257 also have a source conductor 308 is slightly different than source conductors 108 and 208. Transistor 250 has drain regions 261 and 262, illustrated in a general manner by arrows, that are similar to regions 161 and 162 of transistor 150.

Gate structures 263 include a shield conductor or shield, such as shields 288-291 that are similar to shields 188-191, overlying a gate conductor or gate, such as gates 281-284 that are similar to respective gates 181-184. Each of cells 255-257 also includes a source region, such as source regions 303 and 305 for example that are similar to respective regions 203 and 205 of transistor 150. Although regions 303 and 305 are illustrated as not underlying gates 281 or 282, in some cases region 303 and/or 305 may diffuse to underlie at least a portion of one of or both of gates 281-282. The channel region of each cell underlies the corresponding gate, such as channel region 259 underlying gate 283, so that current flows laterally through the channel region. Although the descriptions may focus attention on cells 256-257 and the nearby material, this is done for clarity of the descriptions and those skilled in the art will appreciate that the descriptions also apply to other cells of transistor 250 such as cell 255 and an adjacent cell (not shown) that may be positioned to the left of cell 255.

FIG. 16-FIG. 22 illustrates various stages in portions of an example of an embodiment of a method of forming transistor 250. These descriptions have references to FIG. 15-FIG. 22.

Figure 16:
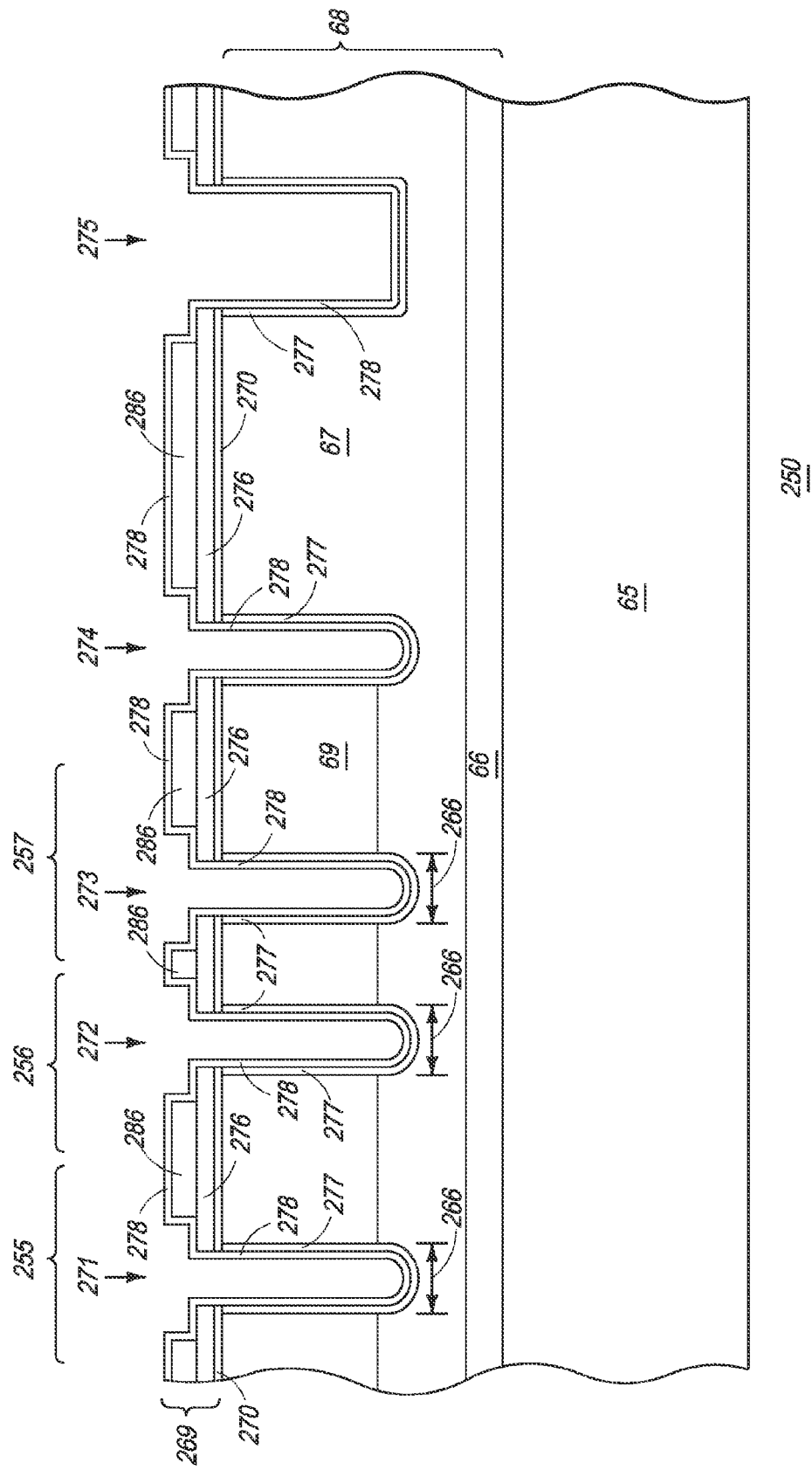
FIG. 16-FIG. 22 illustrate various stages in portions of an example of an embodiment of a method of forming the semiconductor device of FIG. 15 in accordance with the present invention.

Referring now to FIG. 16, region 69 is formed prior to forming any openings within layer 68 of semiconductor material. During this operation, a first insulating layer 270 typically is formed on the surface of region 69 and layer 67. Subsequently, a protective layer 276 is formed on layer 270. Another insulator layer 286 is formed on layer 276. The material and methods for forming layers 270, 276, and 279 are similar to respective layers 170, 176, and 179 of FIG. 8. Layer 286 preferably is formed from silicon dioxide but may be other materials in other embodiments such as silicon nitride of other equivalent material. The thickness of layer 286 generally is greater than the thickness of layers 270 and/or 276. Layers 270, 276, and 286 will be used as a hard-mask or mask 269 for forming other elements of transistor 250. Openings are formed through layer 286 overlying openings 271-275, however, the openings in layer 286 generally have a greater width than openings 271-275 through mask 269.

Thereafter, openings 271-275 are formed through the layers of mask 269 in a manner similar to forming respective openings 171-175 in the description of FIG. 8. Those skilled in the art will appreciate that the process of forming openings 271-275 may result in forming openings 271-275 to have a greater width in the material of layer 286. For example, an isotropic etch may be used on layer 286 which may cause the resulting openings in layer 286 to have a greater width than openings 271-275 through mask 269. A first insulator 277 and an optional second insulator 278 may be formed in openings 271-275 in a manner similar to insulators 177 and 178 in the description of FIG. 8. As will be seen further hereinafter, insulators 277-278 form the gate insulator for cells 255-257. Insulator 278 may be used if it is desirable to increase the thickness of the gate insulator of transistor 250. Those skilled in the art will appreciate that the material of layer 278 may extend along the top of layer 286 and along the sidewalls of openings 271-275. Openings 271-273 have a width 266 that is similar to width 166 (FIG. 8).

Figure 17:
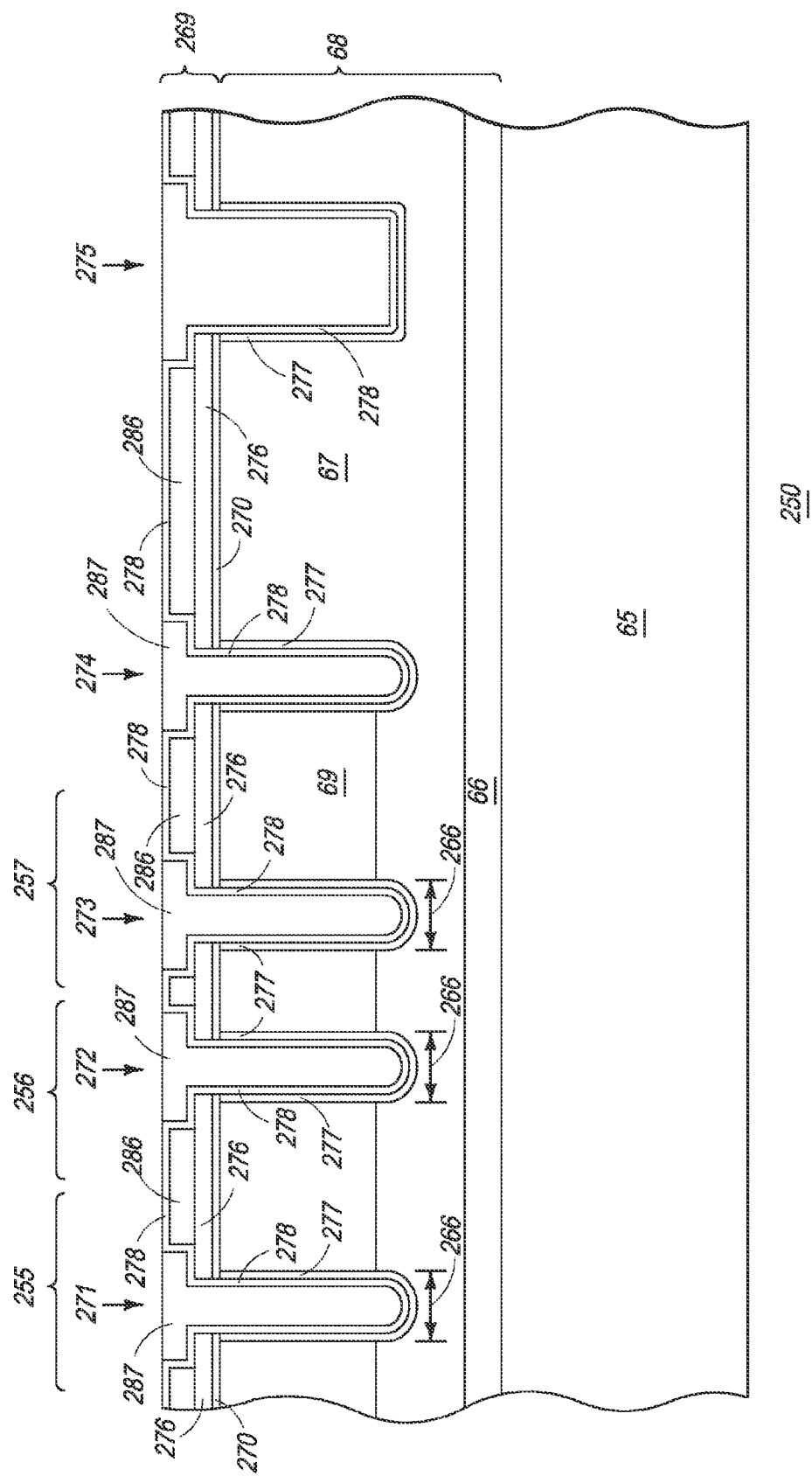

FIG. 17 illustrates a subsequent stage in the example of an embodiment of a method of forming transistor 250. A conductor material 280 is formed within the remaining portions of openings 271-275 including the openings formed in layer 286. Conductor material 280 and the formation method is similar to material 180 that was described in the description of FIG. 8. However, material 280 is not removed from within openings 271-275 at this step in the method. The portion of material 280 in the openings within layer 286 forms a cap 287 at the top of material 280. In other embodiments, portions of material 280 may be formed on the surface of layer 286 and may be removed such as by CMP or an etching procedure or other equivalent procedure.

Figure 18:
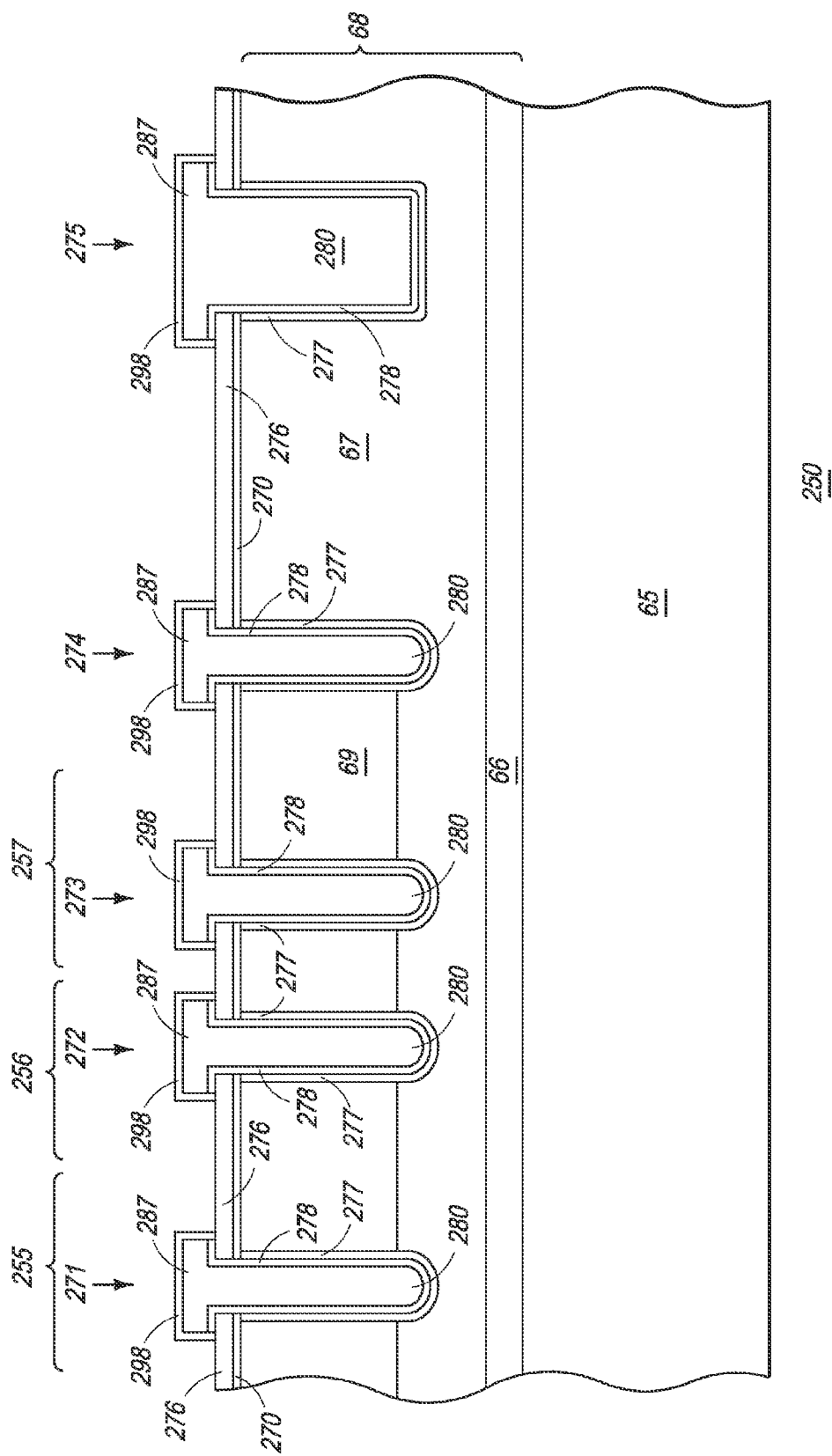

FIG. 18 illustrates a subsequent stage in the example of an embodiment of a method of forming transistor 250. The material of layer 286 and underlying portions of layer 278 are removed which exposes cap 287 of conductor material 280. Portions of layer 278 that underlie cap 287 typically remains. In some embodiments, the removal step may reduce the thickness of caps 287. Subsequently, another insulator layer or insulator 298 is formed on caps 287 to protect material 280 in subsequent operations. The step of forming insulator 298 may also form portions of layer 298 on the surface of layer 276. In other embodiments, layer 276 may be blocked from the material of insulator 298.

Figure 19:
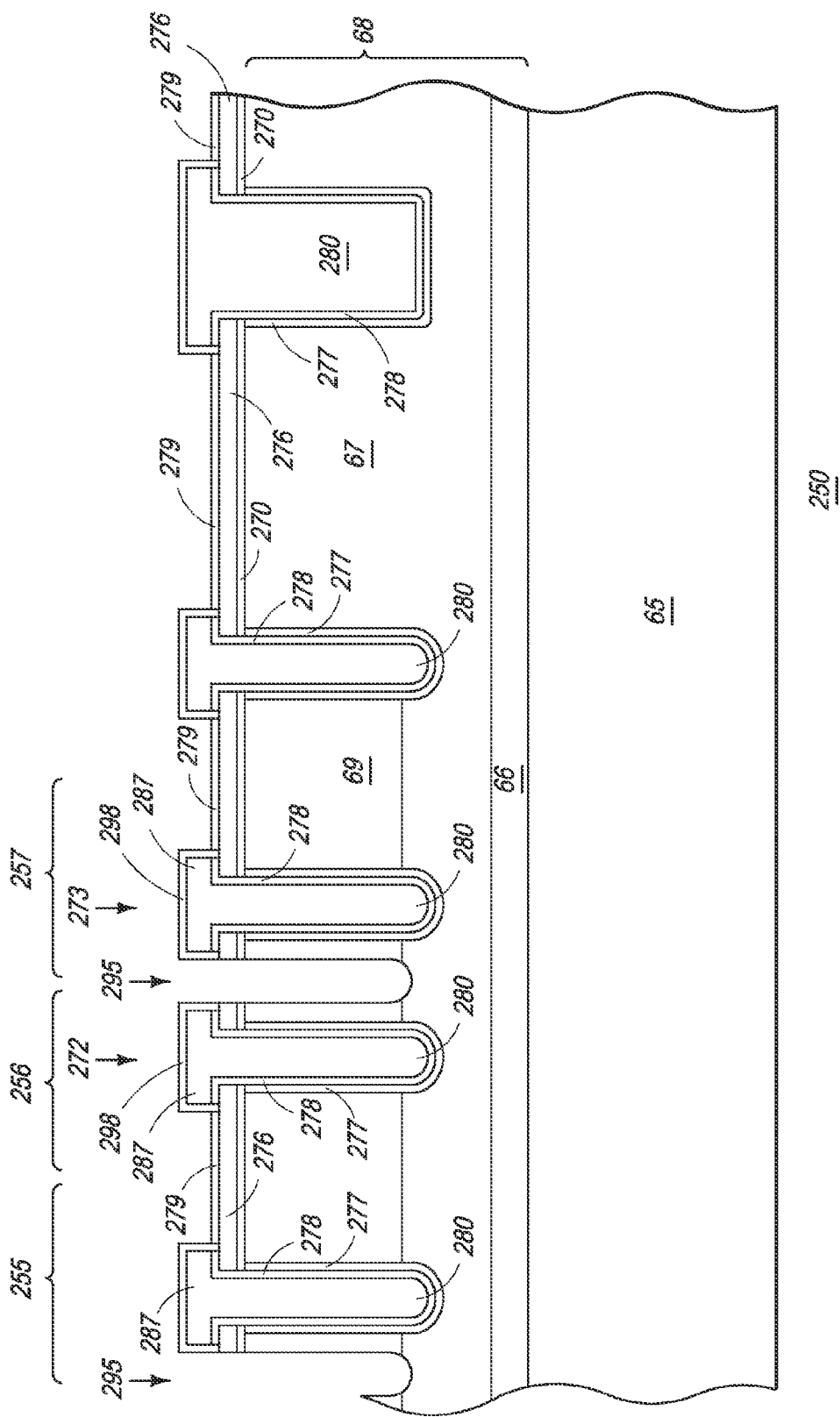

FIG. 19 illustrates another subsequent stage in the example of an embodiment of a method of forming transistor 250. Optionally, another insulator layer 279 may be formed on the surface of layer 276 to protect the top of layer 278 from subsequent operations. An opening 295 is formed in the portion of insulator 298 and underlying layers that overlies the region where a source is to be formed for cells 255-257. Opening 295 exposes the surface of region 69 that is between openings 272 and 273. Opening 295 overlies the region between openings 272 and 273 that overlies where sources 303 and 305 are to be formed. Typically, a photomask, not shown, is patterned with an opening where opening 295 is to be formed, and the exposed portions of layer 279 is removed. Since layers 279 and 276 generally are different materials, a separate step is typically used to remove the underlying portion of layer 276. Another step may be used to remove the underlying portions of layer 270 and expose the underlying surface of region 69. Opening 295 facilitates forming self-aligned source regions and source conductors for transistor 250.

The exposed portion of region 69 is removed to extend opening 295 through region 69 and expose the surface of layer 67. In some embodiments, opening 295 may extend into layer 67 and in other embodiments a portion of region 69 may remain in opening 295. The photomask may subsequently be removed.

Figure 20:
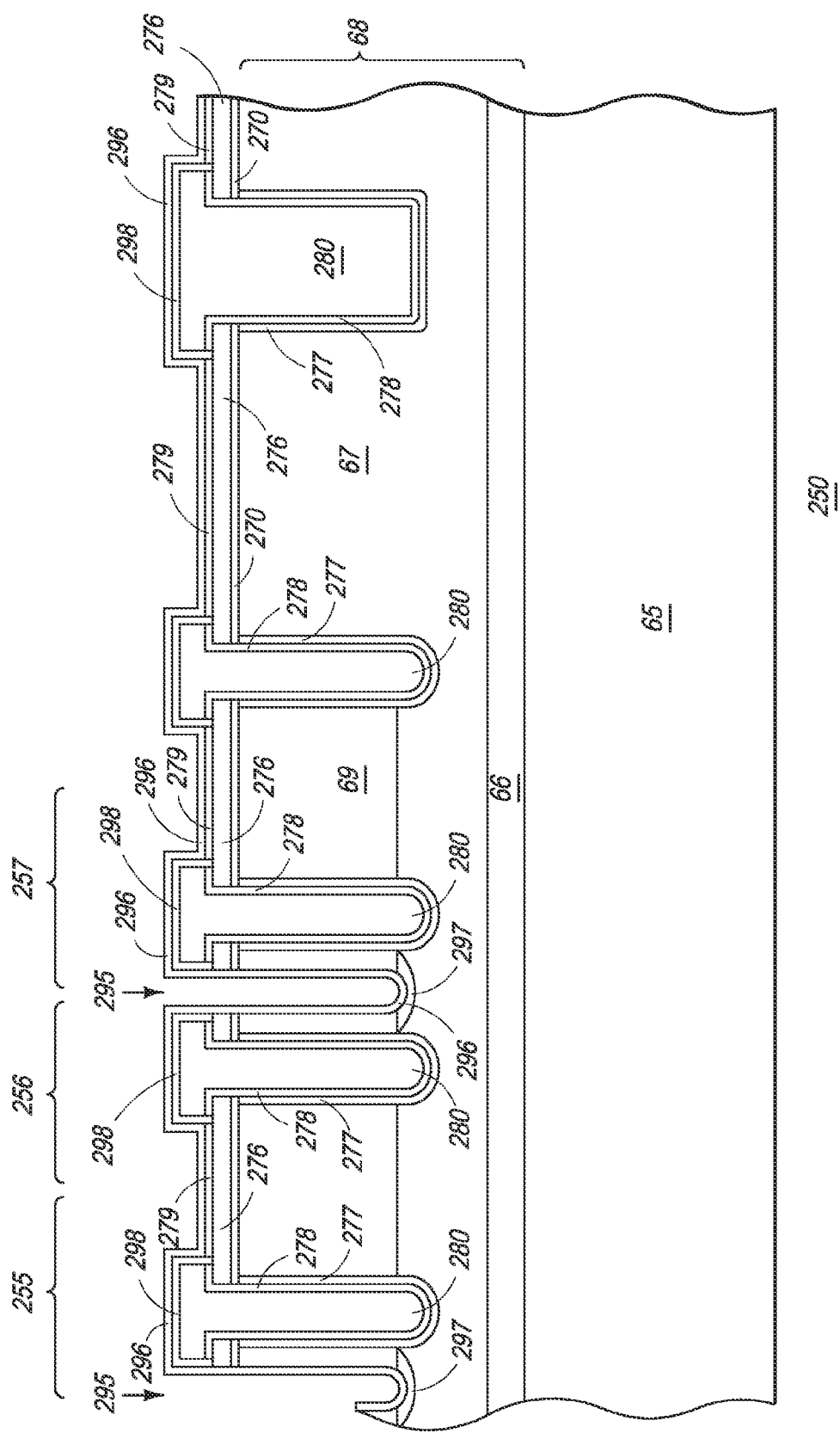

FIG. 20 illustrates another subsequent stage in the example of an embodiment of a method of forming transistor 250. A doped semiconductor material 296 is formed within opening 295. In the preferred embodiment, material 296 is doped polysilicon but may be other types of semiconductor material that can be used to diffuse dopants into other regions. Material 296 is formed on the bottom of opening 295 and in some embodiments on the sidewalls of opening 295. In other embodiments, a portion of material 296 may also be formed on insulator 298. Material 296 typically is formed as a layer on the sidewalls and bottom of opening 295 and typically does not fill opening 295. In some embodiments material 296 may fill opening 295 as illustrated by material 196 of FIG. 12. Those skilled in the art will appreciate that some portions of material 296 may also be formed on the surface of layer 279 and layer 298 as illustrated. In other embodiments, those portions may be blocked from material 296 such as by a mask or other manner. Thereafter, dopants from material 296 are diffused into layer 67 to form a master source region 297 on the surface of layer 67. Region 297 is similar to region 197 described in the description of FIG. 12. Although region 297 is illustrated as not underlying any of gate structures 263, in some cases region 297 may diffuse to underlie at least a portion of one of or both of the adjacent structures 263.

Figure 21:
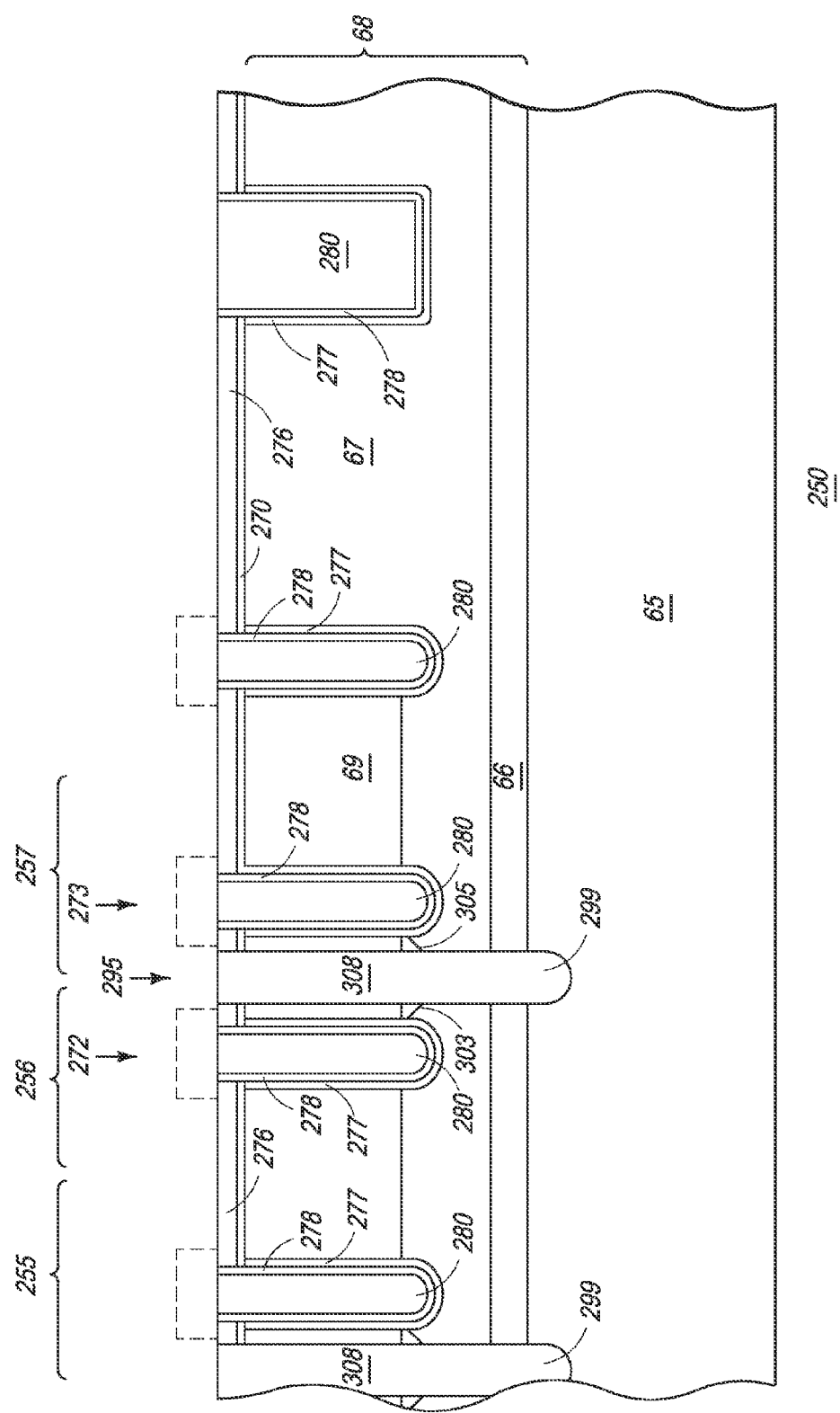

FIG. 21 illustrates another subsequent stage in the example of an embodiment of a method of forming transistor 250. An opening 299 is formed to extend through region 297 and layers 67 and 66 to expose the surface of substrate 65. In most embodiments, opening 299 may extend a distance into substrate 65. Opening 299 typically is narrower than the width of opening 295, such as by the thickness of material 296. Opening 299 separates region 297 into two separate source regions 303 and 305 for respective cells 256 and 257.

Subsequently, all portions of material 296, insulator 298, and layer 279 that are overlying layer 276 are removed. Caps 287 are also removed, as illustrated by dashed lines. Typically, material 296, insulator 298, and layer 279 are removed and a separate operation is used to remove caps 287. For example, an etching operation that stops on the material of layer 276 may be used to remove material 296, insulator 298, and layer 279. Caps 287 may then be removed by CMP or etching or other similar techniques.

Opening 299 separates region 297 into two separate source regions 203 and 205 for respective cells 256 and 257. A source conductor 308 is then formed within opening 299 to form an ohmic electrical connection to source regions 303 and 305 and layers 66-67, and to substrate 65 for the embodiment where opening 299 extends to substrate 65. Conductor 308 is similar to conductor 208 (FIG. 14).

Figure 22:
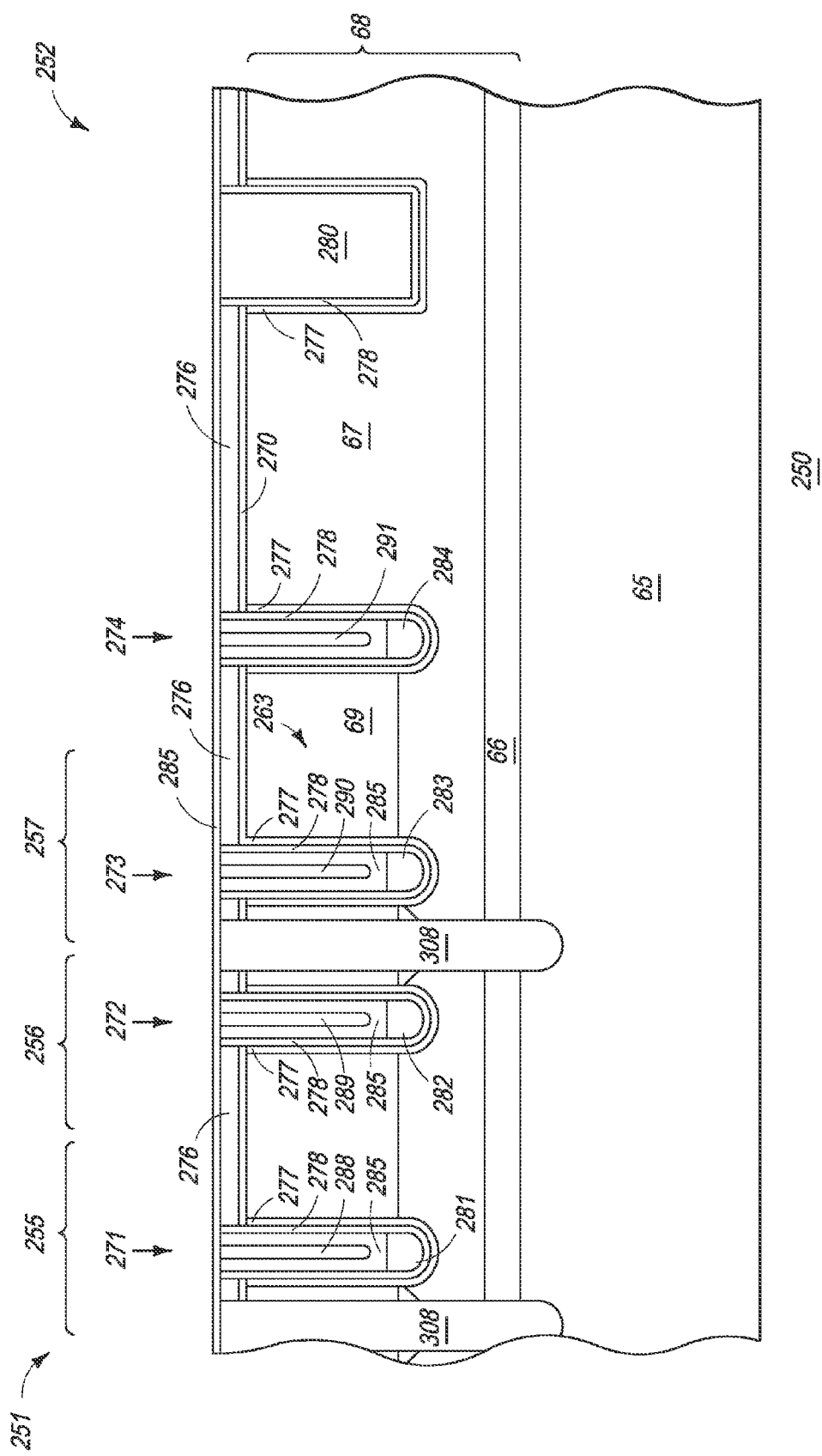

FIG. 22 illustrates another subsequent stage in the example of an embodiment of a method of forming transistor 250. Remaining portions of gate structures 263 are formed. A portion of material 280 within openings 271-274 is removed to form gate conductors 281-284 within respective openings 271-274 and overlying portions of layer 67. The removal operation may be similar to the removal operation explained in the description of FIG. 9 for material 180. A shield insulator 285 is formed within openings 271-275 in a manner similar to insulator 185 (FIG. 9). Insulator 285 typically is also formed on conductors 308, on layer 276, and on material 280 within opening 275. Shield conductors 288-291 are formed within the openings of insulator 285. Conductors 288-291 are formed similar to conductors 188-191 that are explained in the description of FIG. 9. However, none of the material of conductors 288-291 is removed after forming conductors 288-291.

Referring back to FIG. 15, an opening may be formed to expose a top portion of conductors 289-290 within gate structures 263 that are adjacent to source regions such as regions 303 and 305. The opening removes the portion of insulators and 277, 278, and 285 that are laterally between conductor 308 and adjacent conductors 289-290. The opening may also remove a portion of conductor 308 that is adjacent to the removed portions of the gate structures 263. Additional openings may also be formed to expose a portion of the surface of region 69 within the drain regions of transistor 250. In other embodiments, two different operations may be used to form the drain openings and the shield conductor openings.

A conductor material is formed in the shield openings to enlarge source conductor 308 to include a source conductor portion 318 that expands conductor 308 to electrically connect to conductors 289-290. The conductor material may also be formed in the drain openings to facilitate forming drain conductors 313 and 315 to the drain regions of cells 255-257. These openings may alternately be formed at a different time from forming the shield conductor openings. Conductors 313 and 315 are similar to conductor 213 and 215 (FIG. 7) and may be formed similarly thereto. An additional opening may be formed overlying material 280 in termination region 252 to form electrical connection thereto. In some embodiments, a drain contact region also may be formed within drain regions 261-262 to facilitate forming electrical connection to the material within region 69. The source conductor, including conductor 308 and portion 318, forms a low resistance ohmic electrical connection between sources 303 and 305 and respective shield conductors 289 and 290.

Figure 23:
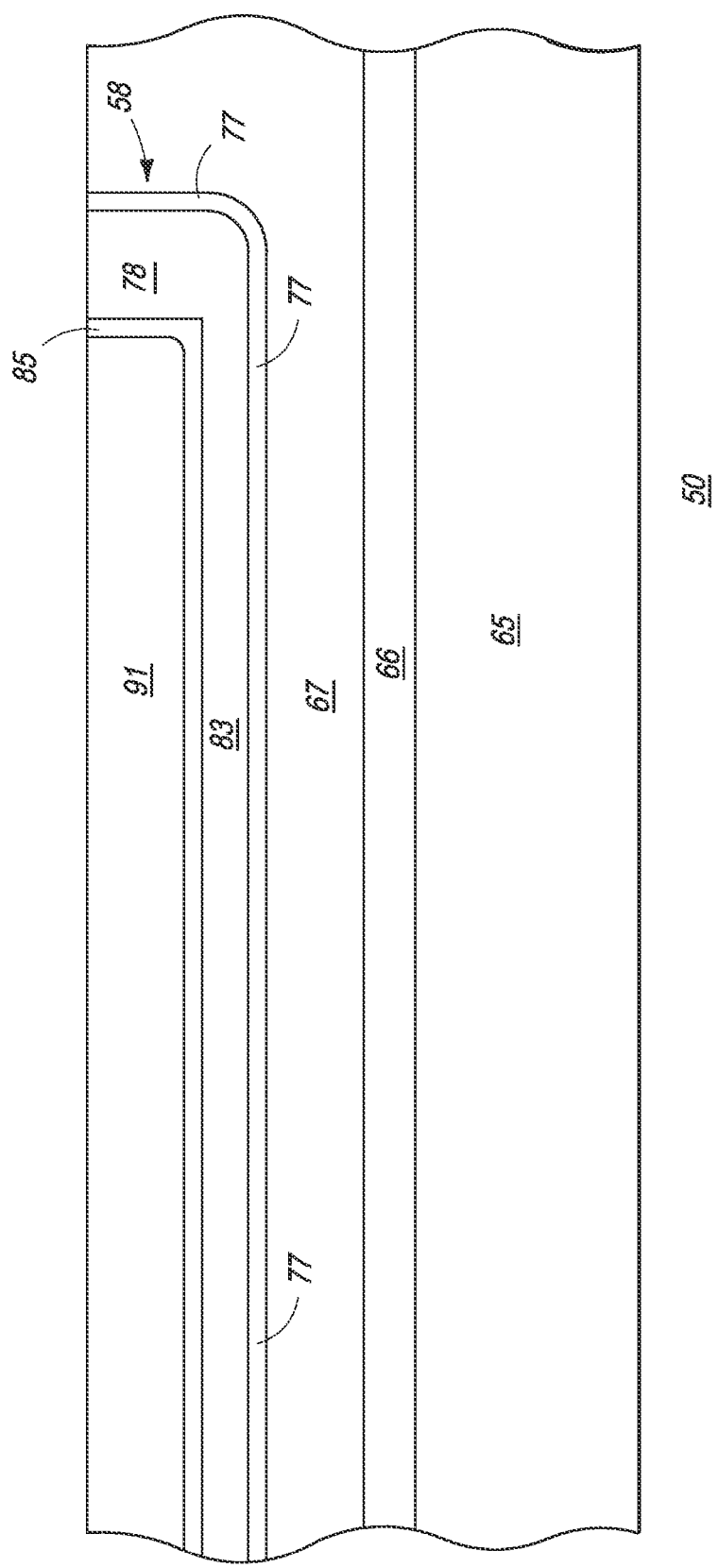
FIG. 23 illustrates an enlarged cross-sectional view of the transistor of FIG. 2 taken across another cross-sectional region in accordance with the present invention.

FIG. 23 illustrates an enlarged cross-sectional view of transistor 50 taken across the length of transistor 50 that extends out of the page of FIG. 1. AS explained hereinbefore in the description of FIG. 1, the material of individual gates 80-83 typically are electrically connected to material 78 of structure 58 at some point. FIG. 23 illustrates one example of an embodiment of a structure to electrically connect gates 80-83 to material 78 of structure 58. In this example embodiment, material 78 of structure 58 extends to intersect the material of gates 80-83 as illustrated by the electrical connection at the intersection of material 78 and gate 83. Those skilled in the art will appreciate that the material of gates 80-82 would extend parallel to gate 83 and also form an electrical connection therebetween, but can not be seen from this cross-section.

From all the foregoing, one skilled in the art will appreciate that in one embodiment, a transistor may comprise, a semiconductor substrate of a first conductivity type, the semiconductor substrate having a first surface and a second surface;

a first semiconductor region, such as region 67 for example, having a second conductivity type on the first surface of the semiconductor substrate;

a second semiconductor region, for example region 69, formed within the first semiconductor region wherein a portion of the first semiconductor region underlies the second semiconductor region, the second semiconductor region having the first conductivity type;

a gate structure, such as gate structure 63 for example, formed in an opening, such as opening 73 for example, that extends from the second semiconductor region into the first semiconductor region;

a gate conductor, for example gate 82, of the gate structure formed within the opening and overlying a first portion, the region under gate 82 for example, of the first semiconductor region;

a source region, such as region 205 for example, adjacent the gate conductor and spaced laterally, such as by insulator 77 for example, from the gate conductor;

a gate insulator, insulator 77 for example, between the gate conductor and the first portion of the first semiconductor region and between the source region and the gate conductor wherein a channel region of the transistor is in the first portion of the first semiconductor region so that current flows laterally between the source region and under the gate structure;

a shield conductor, such as conductor 90 for example, overlying the gate conductor; and a shield insulator, portion of insulator 85 between gate 82 and shield 90 for example, between the gate conductor and the shield conductor.

In another embodiment the transistor may include that the gate structure is devoid of a shield conductor underlying the gate conductor, for example devoid of a conductor that is electrically connected to shield 90 either directly of connected via another conductor.

Another embodiment of the transistor may also include a source contact conductor, such as conductor 108 or 208 or 308 for example, extending through the second semiconductor region and through the source region and into the first semiconductor region to form an ohmic electrical connection to the source region and the first semiconductor region.

In another embodiment, the transistor may include an insulator, such as insulator 99 for example, positioned between a portion of the source contact conductor that extends through the second semiconductor region.

Another embodiment of the transistor may include that the source region is formed as a doped region on the surface of the first semiconductor region.

The transistor may also include that the source contact conductor directly contacts the source region and forms the ohmic electrical connection thereto wherein the source region is devoid of a separate doped contact region, for example devoid of a separate doped region that functions as a contact region within the doped region of the source region, positioned between the source contact conductor and the source region.

Another embodiment of the transistor may include that the source contact conductor directly contacts the first semiconductor region and forms the ohmic electrical connection thereto and wherein the first semiconductor region is devoid of a separate doped contact region positioned between the source contact conductor and the first semiconductor region.

The transistor may also include that the source contact conductor also forms an ohmic electrical contact to the shield conductor.

Another embodiment of the transistor may include that the gate insulator abuts the shield insulator.

In another embodiment of the transistor, the shield conductor is formed within an opening that is formed to extend into the shield insulator.

Another embodiment of the transistor may include that the shield insulator is tapered to have a thickness that decreases for at least a portion of a distance into the semiconductor region increases.

In another embodiment the transistor may include that the shield insulator is tapered to have a thickness that decreases as the distance into the semiconductor region increases.

Those skilled in the art will also appreciate that an embodiment of a semiconductor device may comprise, a semiconductor material, such as the material of layer 67 for example, of a first conductivity type having a first surface and a second surface;

a first region, such as region 69 for example, of the semiconductor material having a second conductivity type;

a gate structure, such as gate structure 63 or 163 or 263 for example, extending into the semiconductor material that is underlying the first region;

a gate conductor of the gate structure;

a gate insulator, such as insulator 77 for example, of the gate structure having a first portion of the gate insulator positioned between the gate conductor and a first portion of the semiconductor material that underlies the gate conductor wherein the first portion of the semiconductor material is configured to form a channel region of the transistor;

a shield conductor of the gate structure overlying the gate conductor;

a shield insulator having a first portion positioned between the shield conductor and the gate conductor, the shield insulator having a second portion positioned between the shield conductor and a second portion of the gate insulator; and a third portion of the shield insulator overlying the shield conductor.

In another embodiment, the semiconductor device may include an opening extending from a surface of the first region into the semiconductor material with the gate insulator positioned on a bottom of the opening and the gate conductor within the opening and on the gate insulator.

Another embodiment of the semiconductor device may include a second portion of the gate insulator positioned along a sidewall of the opening and abutting the shield insulator, for example the portion of insulator 77 adjacent the sidewall of opening 74 and abutting shield 90 for example.

The semiconductor device may also include that the shield conductor is within the opening, such as opening 74 for example, and overlying the gate conductor.

In another embodiment, the semiconductor device may also include a source region of the semiconductor device adjacent to and spaced apart from the gate conductor, such as spaced apart by the distance of insulator 77, and in another embodiment spaced laterally apart.

Those skilled in the art will also appreciate that a method of forming a semiconductor device may comprise, providing a multi-layer semiconductor material, having a first layer of a first conductivity type, such as layer 67 for example or layers 66 and 67 for example or substrate 65 and layer 67 for example, having a first region, such as region 69 for example, of a second conductivity type overlying the first layer, having a plurality of openings, such as openings 72 and 73 for example, that extend from a surface of the first region into the first layer wherein the plurality of openings have sidewalls, a gate insulator formed on the sidewalls of a first opening of the plurality of openings, and a gate conductor material within the first opening;

removing a first portion of the gate conductor material, such as the portion of material 78 above gate 82 for example, from the first opening and leaving a second portion of the gate conductor material within the first opening as a gate conductor wherein a portion of the first layer that underlies the gate conductor, such as the portion underlying gate 82 and insulator 77, forms a channel region of the semiconductor device;

forming a shield insulator within the first opening and overlying the gate conductor; forming a shield conductor overlying the gate conductor; and forming a source conductor, such as conductor 108 and extension 118 for example, on a portion of the shield conductor to form an electrical connection between the shield conductor and the first layer.

Another embodiment of the method may also include forming a source conductor to extend through the first region and into the first layer including forming the source conductor, such as one of conductors 108 and/or 208, after forming the shield conductor, such as conductor 90, and before forming the electrical connection between the source conductor and the shield conductor.

The method may also include forming the shield insulator with a second opening within the shield insulator, such as opening 86 for example, with at least a portion of the second opening, such as the sidewall of the second opening for example, extending substantially parallel to the sidewalls of the first opening, and forming the shield conductor within at least a portion of the second opening.

Another embodiment of the method may include, forming a source region of the second conductivity type in the first layer and proximal to the gate conductor, such as adjacent to gate 82 and spaced apart by at least the distance of insulator 77 for example.

The method may further include forming the source conductor to electrically contact the source region.

In another embodiment, the method may also include forming the source conductor, such as conductor 308 for example, prior to removing the first portion of the gate conductor material from the first opening.

In view of all of the above, it is evident that a novel semiconductor device and method is disclosed. Included, among other features, is forming a low resistance ohmic connection between the source conductor and the shield conductor which results in a low resistance for the shield conductor. The low resistance facilitates forming a higher switching frequency for the transistor. Also included is forming the transistor to have lateral current flow in the channel region which results in a shorter channel length which also improves the switching frequency.

While the subject matter of the descriptions are described with specific preferred embodiments and example embodiments, the foregoing drawings and descriptions thereof depict only typical and/or examples of embodiments of the subject matter and are not therefore to be considered to be limiting of its scope. It is evident that many alternatives and variations will be apparent to those skilled in the art. Although the embodiment of a transistor 50 is used as a vehicle to explain the subject matter of the invention, those skilled in the art will appreciate that alternatives are possible. Although the drain regions are illustrated with wider spacing than the source regions, those skilled in the art will appreciate that the spacing may also be substantially the same or the source spacing could be wider. The doping of region 69 is selected such that when a drain-to-source voltage is applied to transistor 50, drain regions 61-62 are substantially fully depleted when the drain-to-source voltage reaches substantially the breakdown voltage. In one embodiment, region 69 may have substantially uniform doping profile. In the preferred embodiment, the doping profile for region 69 varies from heavily doped near the surface of region 69 to more lightly doped near the interface with layer 67. Although the devices are described as silicon semiconductor devices, those skilled in the art understand that at least some elements herein, such as the gate structures for example, are also applicable to devices using other semiconductor materials such as gallium nitride (GaN).

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A transistor comprising:
    a semiconductor substrate of a first conductivity type, the semiconductor substrate having a first surface and a second surface;
    a first semiconductor region having a second conductivity type on the first surface of the semiconductor substrate;
    a second semiconductor region formed within the first semiconductor region wherein a portion of the first semiconductor region underlies the second semiconductor region, the second semiconductor region having the first conductivity type;
    a gate structure formed in an opening that extends from the second semiconductor region into the first semiconductor region;
    a gate conductor of the gate structure formed within the opening and overlying a first portion of the first semiconductor region;
    a source region adjacent the gate conductor and spaced laterally from the gate conductor;
    a gate insulator between the gate conductor and the first portion of the first semiconductor region and between the source region and the gate conductor wherein a channel region of the transistor is in the first portion of the first semiconductor region so that current flows laterally between the source region and under the gate structure;
    a shield conductor overlying the gate conductor; and
    a shield insulator between the gate conductor and the shield conductor.

2. The transistor of claim 1 wherein the gate structure is devoid of the shield conductor underlying the gate conductor.

3. The transistor of claim 1 further including a source contact conductor extending through the second semiconductor region and through the source region and into the first semiconductor region to form an ohmic electrical connection to the source region and the first semiconductor region.

4. The transistor of claim 3 further including an insulator positioned between a portion of the source contact conductor that extends through the second semiconductor region.

5. The transistor of claim 3 wherein the source contact conductor directly contacts the source region and forms the ohmic electrical connection thereto and wherein the source region is devoid of a separate doped contact region positioned between the source contact conductor and the source region.

6. The transistor of claim 3 wherein the source contact conductor directly contacts the first semiconductor region and forms the ohmic electrical connection thereto and wherein the first semiconductor region is devoid of a separate doped contact region positioned between the source contact conductor and the first semiconductor region.

7. The transistor of claim 3 wherein the source contact conductor also forms an ohmic electrical contact to the shield conductor.

8. The transistor of claim 1 wherein the shield insulator is tapered to have a thickness that decreases as a distance into the second semiconductor region increases.

9. The transistor of claim 1 wherein the shield conductor is formed within another opening that is formed to extend into the shield insulator.

10. A semiconductor device comprising:
    a semiconductor material of a first conductivity type having a first surface and a second surface;
    a first doped region within the semiconductor material and having a second conductivity type;
    a gate structure extending into the semiconductor material that is underlying the first doped region;
    a gate conductor of the gate structure;
    a gate insulator of the gate structure extending through the first doped region into the semiconductor material and having a first portion of the gate insulator positioned between the gate conductor and a first portion of the semiconductor material that is external to the first doped region and that underlies the gate conductor wherein the first portion of the semiconductor material is a channel region of the semiconductor device wherein the channel region is configured so that current flows laterally under the gate structure;
    a shield conductor of the gate structure overlying the gate conductor; and
    a shield insulator having a first portion overlying the shield conductor.

11. The semiconductor device of claim 10 wherein the gate structure includes an opening extending from a surface of the first doped region into the semiconductor material with the gate insulator positioned on a bottom of the opening and the gate conductor within the opening and on the gate insulator.

12. The semiconductor device of claim 11 wherein a second portion of the gate insulator is positioned along a sidewall of the opening and abutting the shield insulator.

13. The semiconductor device of claim 11 wherein the shield conductor is within the opening and overlying the gate conductor.

14. The semiconductor device of claim 10 further including a source region of the semiconductor device adjacent to and spaced apart from the gate conductor wherein the source region is also adjacent to an interface of the semiconductor material and the first doped region.

15. The semiconductor device of claim 10 wherein the shield insulator also includes a second portion positioned between the shield conductor and the gate conductor, and a third portion positioned between the shield conductor and a second portion of the gate insulator.

16. The semiconductor device of claim 10 wherein the gate structure has an end positioned in the semiconductor material and wherein the shield conductor overlies the end of the gate structure.

17. The semiconductor device of claim 10 wherein the gate structure has an end in the semiconductor material and wherein at least a portion of the channel region underlies the end of the gate structure.

18. The semiconductor device of claim 10 having a source region formed along an interface of the first doped region and the semiconductor material.

19. A semiconductor device comprising:
    a semiconductor material of a first conductivity type having a first surface and a second surface;
    a first doped region of within the semiconductor material and having a second conductivity type;
    a gate structure extending into the semiconductor material that is underlying the first region;
    a gate conductor of the gate structure;
    a gate insulator of the gate structure having a first portion of the gate insulator positioned between the gate conductor and a first portion of the semiconductor material that is external to the first doped region and that underlies the gate conductor wherein the first portion of the semiconductor material is a channel region of the semiconductor device;

a shield conductor of the gate structure overlying the gate conductor; and a shield insulator having a first portion overlying the shield conductor and electrically insulating the shield conductor from the gate conductor.

\* \* \* \* \*